United States Patent [19]

Nakagawa et al.

[11] Patent Number: 5,453,135
[45] Date of Patent: Sep. 26, 1995

[54] PHOTOELECTRIC CONVERSION DEVICE WITH IMPROVED BACK REFLECTION LAYER

[75] Inventors: Katsumi Nakagawa, Nara; Noboru Toyama, Hirakata; Toshihiro Yamashita, Kyoto, all of Japan

[73] Assignee: Canon Kabushiki Kaisha, Tokyo, Japan

[21] Appl. No.: 174,011

[22] Filed: Dec. 28, 1993

[30] Foreign Application Priority Data

Dec. 28, 1992 [JP] Japan ................... 4-347457

[51] Int. Cl.$^6$ ................................. H01L 31/06
[52] U.S. Cl. .................. 136/259; 136/249; 136/256; 136/258; 204/192.29; 257/436; 257/458
[58] Field of Search ............... 136/256, 258 AM, 136/259, 249 TJ; 257/436, 458; 204/192.29

[56] References Cited

U.S. PATENT DOCUMENTS

| | | | |
|---|---|---|---|
| 4,419,533 | 12/1983 | Czubatyj et al. | 136/259 |
| 4,492,181 | 1/1985 | Ovshinsky et al. | 118/718 |
| 4,532,372 | 7/1985 | Nath et al. | 136/256 |
| 4,598,306 | 7/1986 | Nath et al. | 257/458 |
| 4,851,302 | 7/1989 | Nakagawa et al. | 428/658 |
| 4,959,106 | 9/1990 | Nakagawa et al. | 136/258 |
| 5,028,488 | 7/1991 | Nakagawa et al. | 428/457 |
| 5,101,260 | 3/1992 | Nath et al. | 257/53 |
| 5,136,351 | 8/1992 | Inoue et al. | 257/436 |
| 5,180,686 | 1/1993 | Banerjee et al. | 437/181 |
| 5,244,509 | 9/1993 | Arao et al. | 136/259 |
| 5,279,681 | 1/1994 | Matsuda et al. | 136/255 |
| 5,296,045 | 3/1994 | Banerjee et al. | 136/249 |
| 5,324,365 | 6/1994 | Niwa | 136/256 |

FOREIGN PATENT DOCUMENTS

| | | | |
|---|---|---|---|
| 60-41878 | 9/1985 | Japan | 136/256 |
| 3-99477 | 4/1991 | Japan | 136/259 |

OTHER PUBLICATIONS

Md. N. Islam et al, *Solar Energy Materials*, vol. 29, pp. 27–35 (Feb. 1993).

Marcuse, D., "Theory of Dielectric Optical Waveguides," pp. 1–59 Academic Press (1991).

*Primary Examiner*—Aaron Weisstuch
*Attorney, Agent, or Firm*—Fitzpatrick, Cella, Harper & Scinto

[57] ABSTRACT

A photoelectric conversion device comprising at least a metal layer, a transparent conductive layer disposed on said metal layer, and an active semiconductor layer disposed on said transparent conductive layer, characterized in that said transparent conductive layer comprises a layer having an uneven surface which is composed of a zinc oxide material having an X-ray diffraction pattern in which (a) the peak intensity of the (2,0,0) planes of $ZnO_2$ is 1/200 or less of (b) the peak intensity of the (0,0,2) planes of ZnO and (c) the peak intensity of the (1,0,1) planes of Zn is 1/200 or less of the peak intensity (b).

20 Claims, 10 Drawing Sheets

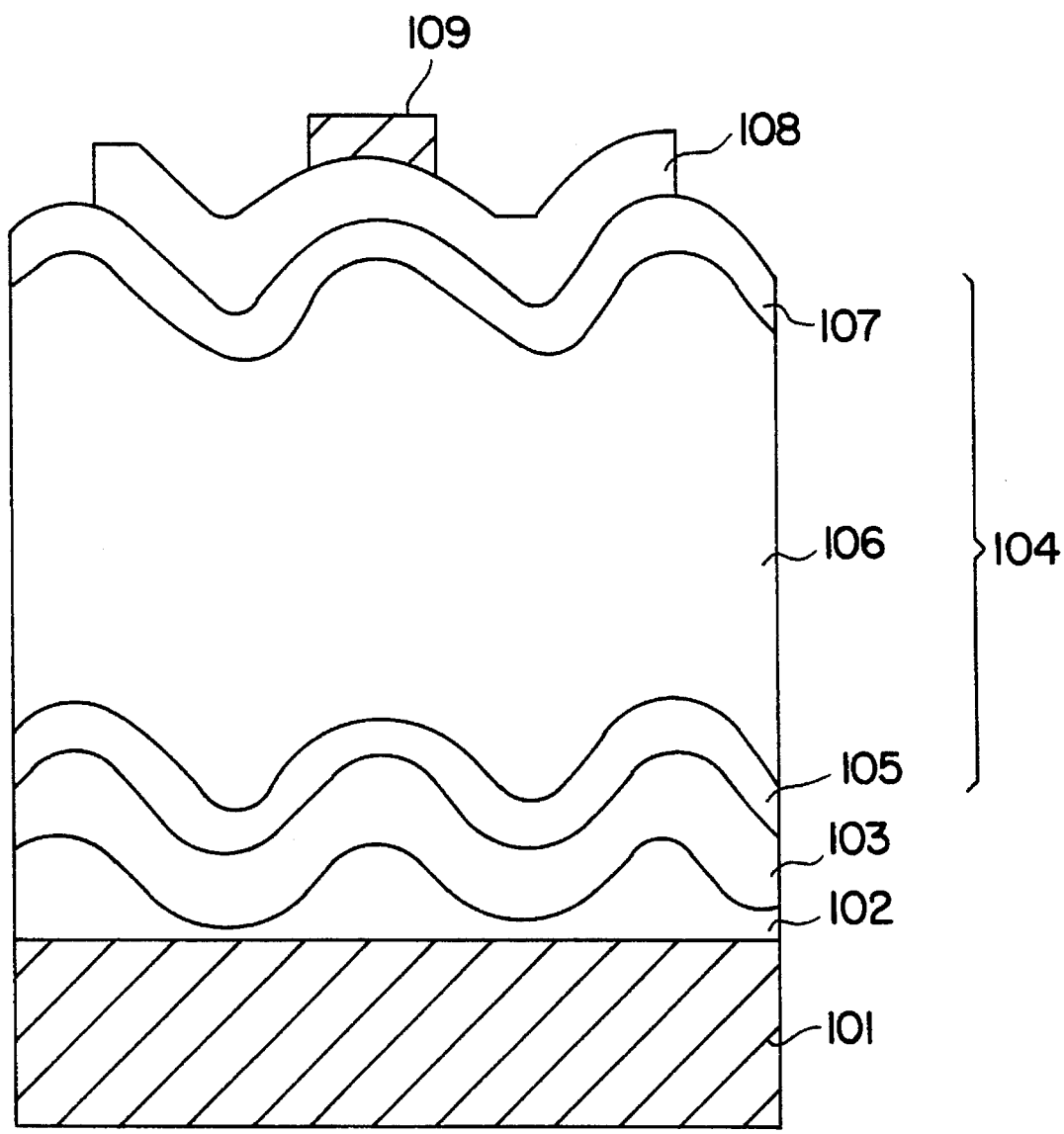
F I G. 1

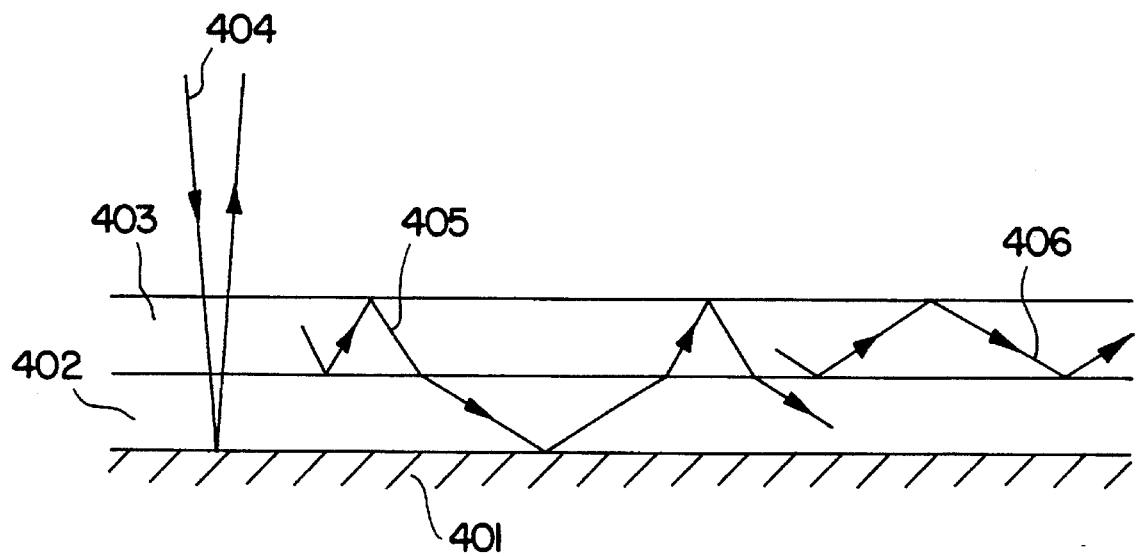
F I G. 4(A)
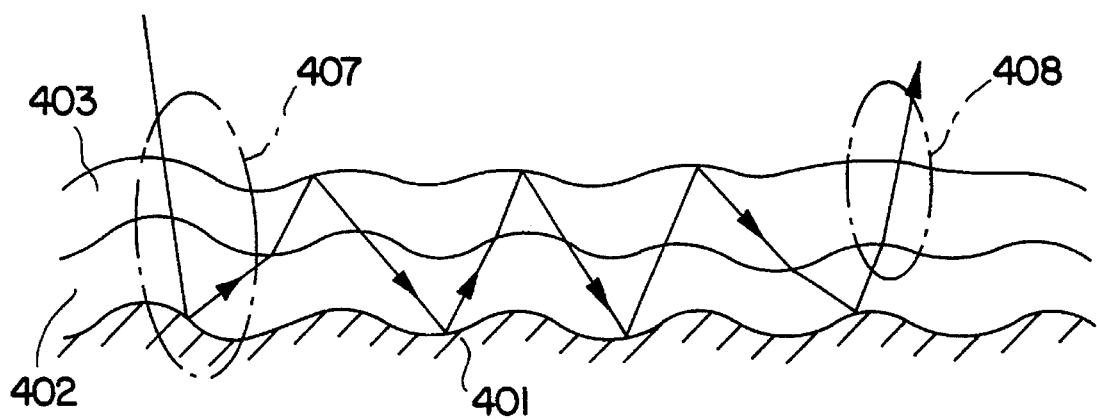
F I G. 4(B)

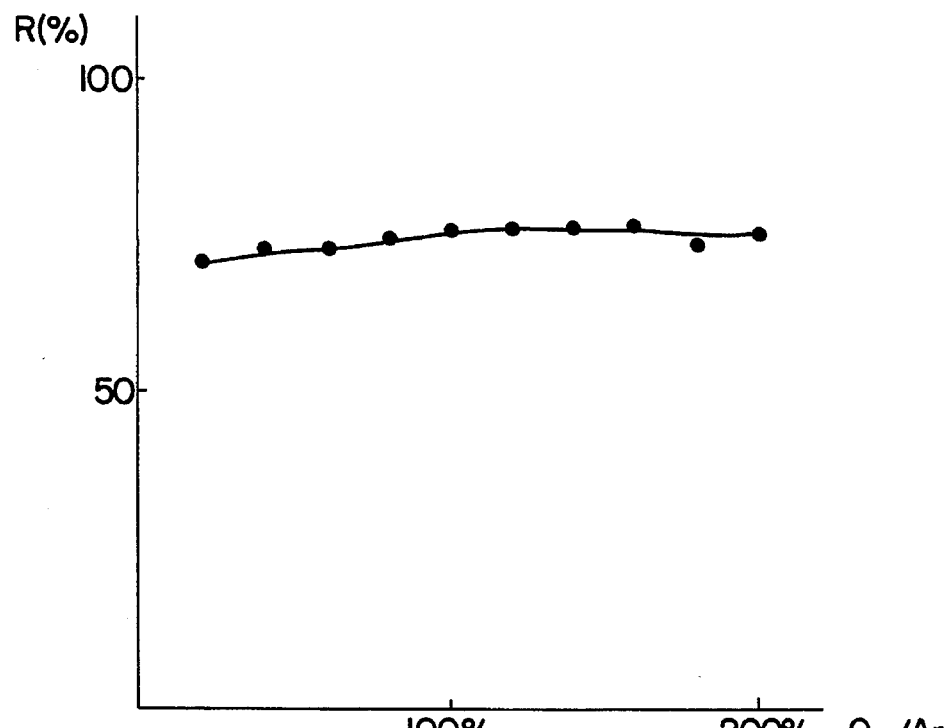
F I G. 5(A)
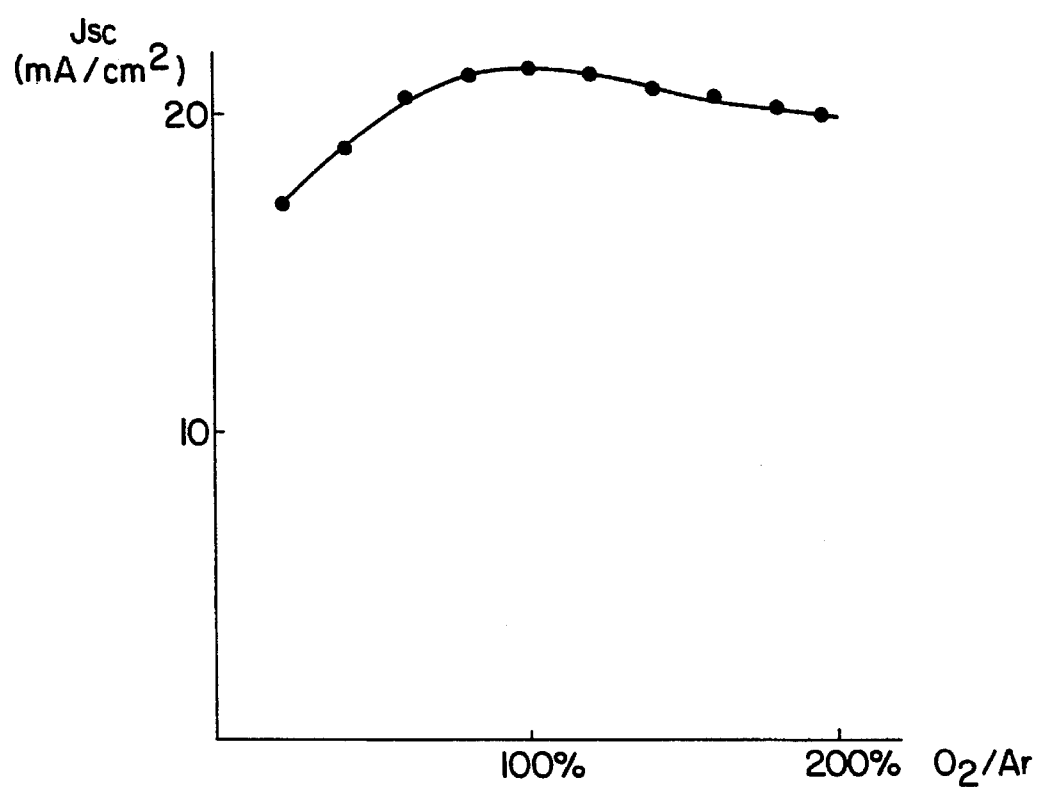
F I G. 5(B)

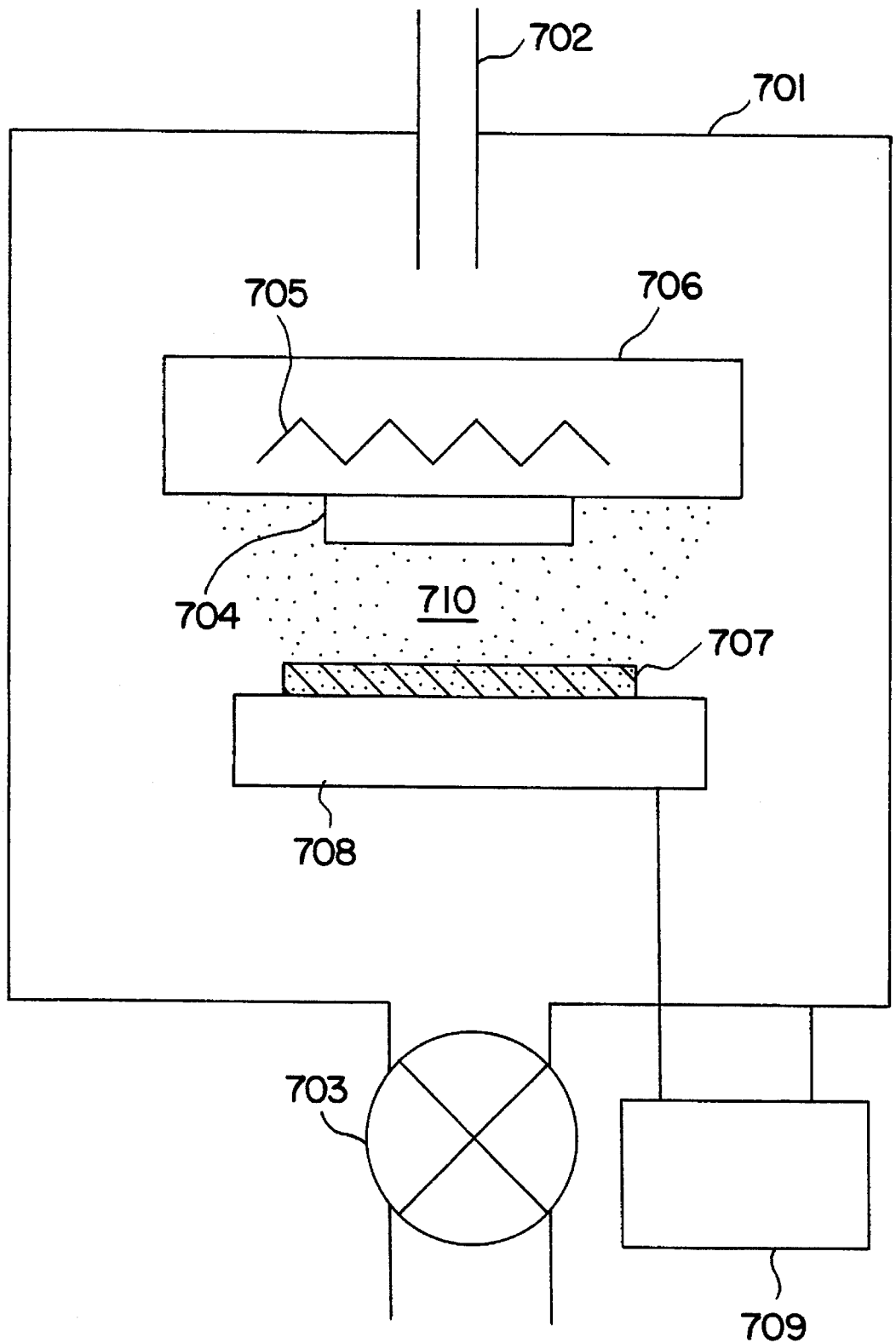
F I G. 7

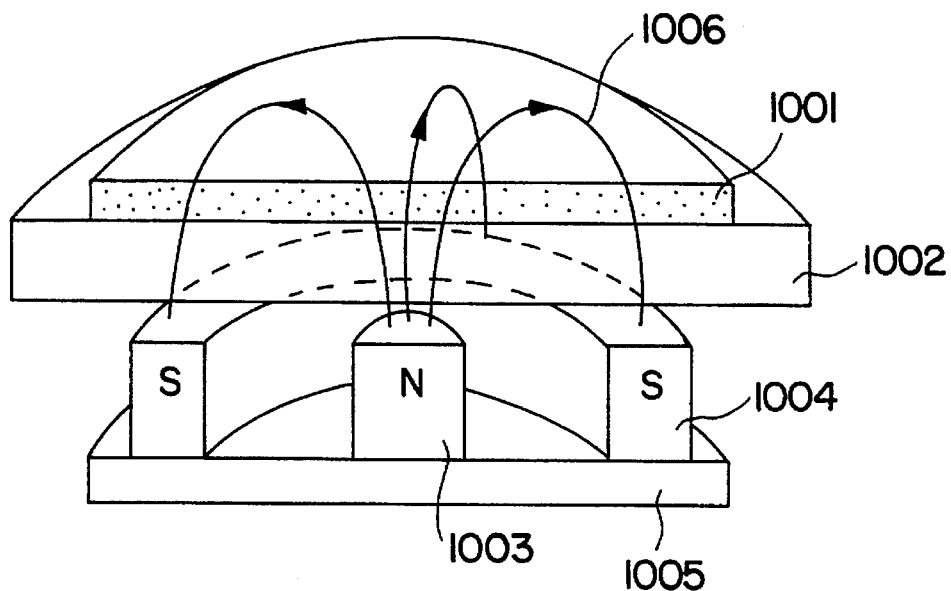
F I G. 10(A)
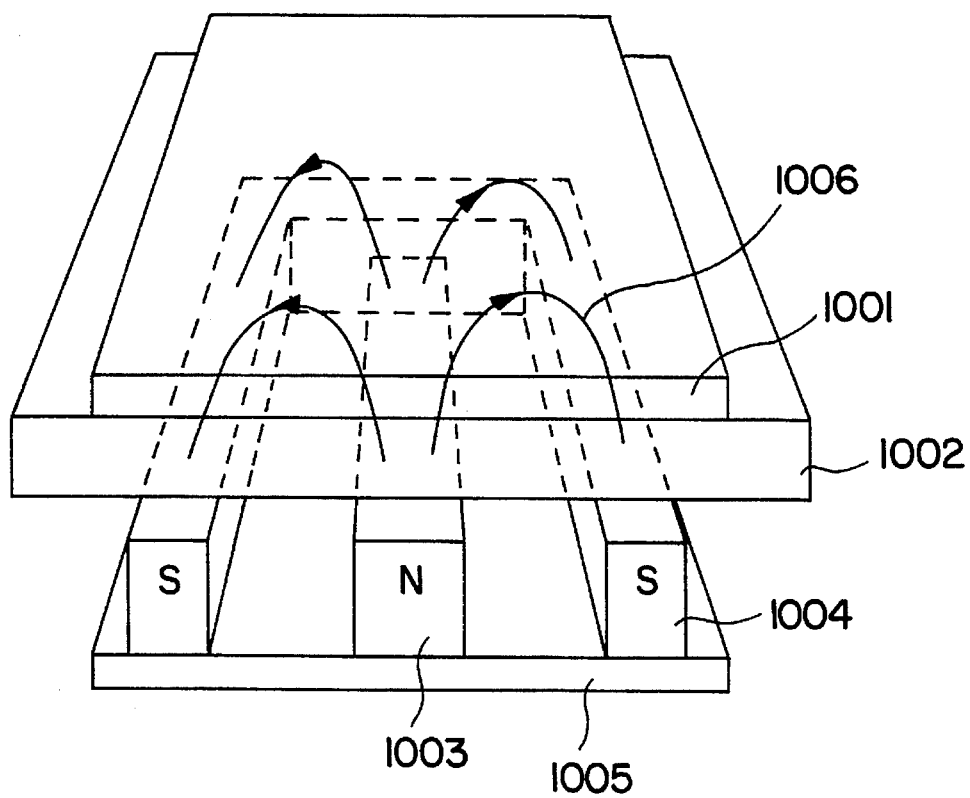
F I G. 10(B)

PHOTOELECTRIC CONVERSION DEVICE WITH IMPROVED BACK REFLECTION LAYER

BACKGROUND OF THE INVENTION

1. Field of the Invention

The present invention relates to an improvement in photoelectric conversion devices for solar cells and for power sources in various electric appliances. More particularly, the present invention relates to a photoelectric conversion device provided with an improved back reflection layer comprising a specific zinc oxide material which enhances the utilization efficiency of incident light in the active semiconductor region and provides improved photoelectric conversion efficiency.

2. Related Background Art

There are known a number of photoelectric conversion elements for solar cells and for power sources in various electric appliances which have been put into practical use. Among those photoelectric conversion elements, there is a solar cell made of a single crystal silicon material, commonly called the "single crystal silicon solar cell." This single crystal silicon solar cell is highly reliable and high in photoelectric conversion efficiency. The single crystal solar cell is produced by ion implantation or thermal diffusion of an impurity into a single crystal substrate of silicon (Si) or gallium arsenide (GaAs), or by epitaxial growth of an impurity-doped layer on said single crystal substrate. However, the production cost is unavoidably costly because of using such a specific single crystal substrate and the cell is extremely difficult to make in a large area.

In any case, in order to make solar cells usable as practical power sources, it is essential that a large area solar cell be industrially mass-produced at a reduced cost. This requirement is not attained by the single crystal solar cell.

In recent years, attention has been focused on the so-called thin film solar cells comprising amorphous silicon (hereinafter referred to as "a-Si") semiconductors or compound semiconductors such as $CdS/CuInSe_2$ and the like. Although they are inferior to the single crystal silicon solar cell, they have various advantages over the single crystal silicon solar cell. For example, their semiconductor layer can be formed on a relatively inexpensive substrate such as glass or stainless, their manufacturing process is relatively simple, they can be designed to be of a large area, and they can be provided at a reduced cost.

Various studies have been made of thin film solar cells to improve their photoelectric conversion efficiency. Particularly, in order to heighten the performance of such thin film solar cells in terms of the utilization efficiency of incident light, it has been proposed to include in the thin film solar cell a metal reflection layer (or a back reflection layer) at the substrate surface capable of reflecting light such as sunlight not absorbed by the thin film semiconductor layer and return it to the thin film semiconductor layer, thereby improving the photoelectric conversion efficiency.

The thin film solar cell according to this proposal can include a configuration in which light is impinged from the substrate side and another configuration in which light is impinged from the side opposite the substrate. The former configuration comprises a transparent substrate, a thin film semiconductor as an optically active semiconductor layer disposed on said transparent substrate, and an electrode layer composed of a metal having a high reflectance such as Ag, Al, or Cu disposed on said thin film semiconductor. The latter configuration comprises a substrate composed of a metal or alloy having a high reflectance and a thin film semiconductor as an optically active semiconductor layer disposed on said substrate.

However, both of these configurations are still problematic in that reflected light is not sufficiently utilized because the thin film semiconductor is relatively thin, hence it is difficult to sufficiently improve the solar cell electrical characteristics.

In order to improve this situation, there is a proposal to interpose a transparent conductive layer comprising a material having a given optical property, such as zinc oxide (ZnO), between the thin film semiconductor (the optically active semiconductor layer) comprising an a-Si material and the metal layer comprising a metal such as Ag, Cu, or Al. The aim is to improve the light utilization efficiency by virtue of multiple-interference effects of the transparent conductive layer while preventing light externally impinging the optically active semiconductor layer from being reflected at the metal layer having a high reflectance and reflected outside the optically active semiconductor layer.

FIG. 3(A) is a graph showing measured results of the reflectance of each of the metals Ag, Cu and Al as the metal layer as a function of the wavelength of the incident light in an a-Si thin film solar cell without a transparent conductive layer. FIG. 3(B) is a graph showing measured results of the reflectance of each of the metals Ag, Cu and Al as the metal layer as a function of the wavelength of the incident light in an a-Si thin film solar cell with such a transparent conductive layer.

Japanese Patent Publication No. 60-41878/1985 (hereinafter referred to as Literature 1) discloses an a-Si thin film solar cell having a transparent conductive layer interposed between a silicon semiconductor photoelectroc conversion layer and a back electrode composed of a metal having a high reflectance to light of a wavelength from 0.3 to 2 μm. The transparent conductive layer prevents formation of an alloy layer at the interface between the silicon semiconductor layer and the back electrode.

U.S. Pat. No. 4,532,372, (hereinafter referred to as Literature 2) and U.S. Pat. No. 4,598,306, (hereinafter referred to as Literature 3) disclose a thin film photovoltaic device of configuration similar to the thin film solar cell described in Literature 1. The transparent conductive layer is composed of a material having a great electrical resistivity to prevent excess current flow between the opposite electrodes even in the case where a short-circuited portion occurs in the active semiconductor region, thereby improving the reliability of the photovoltaic device.

However, each of the transparent conductive layers described in Literatures 1 to 3 causes multiple-interference effects of the incident light in the direction parallel to the direction of the incident light by virtue of the difference between the refractive index of the active semiconductor layer or region and that of the transparent conductive layer at the interface between them. This improves the utilization efficiency of reflected light to a certain extent but is not satisfactory.

U.S. Pat. No. 4,419,533, (hereinafter referred to as Literature 4) discloses a photovoltaic device having an incident radiation directing means comprising a metal layer having a surface with a textured structure and a transparent conductive layer having an uneven surface provided with irregularities disposed on the textured surface of the metal layer, in which the transparent conductive layer serves as a back reflection layer. In Literature 4 incident light is scattered at the surface through which light is impinged or at the interface between the back reflection layer and the semiconductor active region. The incident light is directed and confined in the semiconductor active region by virtue of light trapping effects, wherein the light is effectively utilized.

Shown in FIG. 1 is a typical example of a thin film solar cell having such a back reflection layer. In FIG. 1, reference numeral 101 indicates an electroconductive substrate. Reference numeral 102 indicates a metal layer having a high reflectance which is laminated on the electroconductive substrate 101. The metal layer 102 has an uneven surface. When the electroconductive substrate 101 is composed of a material having a sufficiently high reflectance and has a randomly roughened surface, the metal layer 102 can be omitted. Reference numeral 103 indicates a layer capable of serving as a transparent conductive layer (back reflection layer) which is laminated on the uneven surface of the metal layer 102. The transparent layer 103 has an uneven surface which conforms to the uneven surface of the metal layer 102. Reference numeral 104 indicates a thin film semiconductor layer composed of an amorphous material such as an a-Si material and having a three-layered structure 105, 106, 107 with a pin junction which is laminated on the uneven surface of the transparent layer 103. Reference numeral 108 indicates a transparent electrode which is disposed on the thin-film semiconductor layer 104. Reference numeral 109 indicates a collecting electrode in a desired shape such as a comb-like shape.

In this thin film solar cell, the transparent layer 103 is composed of a material which is transparent to the light passing through the thin film semiconductor layer and has a desired electric resistivity. The three-layered structure of the thin film semiconductor region 104 comprises an n-type semiconductor layer 105 composed of an amorphous material having photoconductivity, an i-type semiconductor layer 106 composed of an intrinsic amorphous material having photoconductivity, and a p-type semiconductor layer 107 composed of an amorphous material having photoconductivity, laminated in this order from the substrate side. When the thin film semiconductor layer 104 is relatively thin, the surface thereof is usually uneven, as shown in FIG. 1.

In the configuration shown in FIG. 1 in which the back reflection layer is disposed, a significant improvement in the photoelectric conversion efficiency is expected. However, in practice, the photoelectric conversion efficiency in this configuration is not as good as originally expected and is still not satisfactory.

Thus, there is an increased demand for a further improved thin film solar cell in which the utilization efficiency of incident light and the photoelectric conversion efficiency are further improved.

SUMMARY OF THE INVENTION

The present invention is aimed at improving the conventional thin film solar cell having a back reflector (the term "back reflector" herein means a multi-layered region comprising a metal layer and a transparent conductive layer) such that incident light is more efficiently utilized and photoelectric conversion efficiency is further improved.

Another object of the present invention is to provide an improved, highly reliable thin film photoelectric conversion device usable as a solar cell capable of serving as a practical power source which has an improved back reflector capable of significantly improving the utilization efficiency of incident light in the active semiconductor region, thereby providing a further improved photoelectric conversion efficiency.

A further object of the present invention is to provide an improved, highly reliable thin film photoelectric conversion device having an improved back reflector free of direct contact between the metal layer and the active semiconductor layer and free of leakage current due to a defective portion present in the active semiconductor layer, wherein incident light is efficiently utilized and photoelectric conversion efficiency is further improved.

A further object of the present invention is to provide an improved, highly reliable thin film solar cell with an improved back reflector free of direct contact between the metal layer and the active semiconductor layer and free of leakage current due to a defective portion in the active semiconductor layer, wherein incident light is efficiently utilized and photoelectric conversion efficiency is further improved.

A further object of the present invention is provide a process for the production of the above photoelectric conversion device.

The photoelectric conversion device according to the present invention basically comprises a substrate having, thereon, a metal layer with a surface having a high reflectance of light, a transparent conductive layer with an uneven surface disposed on the highly reflective surface of the metal layer, and a photoelectric conversion semiconductor region disposed on the uneven surface of the transparent conductive layer. Said transparent conductive layer comprises a material having a randomly roughened surface which is constituted by a specific zinc oxide material having an X-ray diffraction pattern in which (a) the peak intensity of the (2,0,0) planes of $ZnO_2$ is $1/200$ or less of (b) the peak intensity of the (0,0,2) planes of ZnO and (c) the peak intensity of the (1,0,1) planes of Zn is $1/200$ or less of the peak intensity (b).

The transparent conductive layer comprised of the above specific zinc oxide can be formed by sputtering a target comprised of Zn or zinc oxide by means of a magnetron sputtering process under conditions of 3 mTorr for the sputtering chamber pressure and 150° to 350° C. for the substrate temperature while flowing oxygen gas or a compound gas containing oxygen.

Thus, the present invention includes a process for the production of the above photoelectric conversion device. Specifically, the process according to the present invention is for the production of a photoelectric conversion device comprising a substrate having, thereon, a metal layer with a surface having a high reflectance of light, a transparent conductive layer with an uneven surface disposed on the highly reflective surface of the metal layer, and a photoelectric conversion semiconductor layer disposed on the uneven surface of the transparent conductive layer. The formation of the transparent conductive layer is carried out by forming a zinc oxide having an X-ray diffraction pattern in which (a) the peak intensity of the (2,0,0) planes of $ZnO_2$ is $1/200$ or less of (b) the peak intensity of the (0,0,2) planes of ZnO and (c) the peak intensity of the (1,0,1) planes of Zn is $1/200$ or less of the peak intensity (b) by sputtering a target comprised of Zn or a zinc oxide by a magnetron sputtering process under conditions of 3 mTorr for the inner pressure and 150° to 350° C. for the substrate temperature while flowing oxygen gas or a compound gas containing oxygen.

In the photoelectric conversion device according to the present invention in which the transparent conductive layer is constituted by the above-described specific zinc oxide, the transparent conductive layer functions as a back reflector which is extremely slight in loss due to light absorption and contributes to efficiently confining incident light in the active semiconductor layer, whereby the effect of confining incident light in the active semiconductor layer is markedly improved. As a result, photoelectric conversion efficiency is significantly improved. In addition, the metal atoms constituting the metal layer are effectively prevented from diffusing into the active semiconductor layer and excessive current flow is effectively prevented if defects such as pinholes should occur in the active semiconductor layer. Thus, the photoelectric conversion device according to the present invention is highly reliable.

BRIEF DESCRIPTION OF THE DRAWINGS

FIG. 1 is a schematic cross-sectional view illustrating the configuration of an example of a photoelectric conversion device according to the present invention.

FIGS. 4(A) and 4(B) are schematic views for explaining the principle of increasing the Jsc depending on the uneven structure at the surface of the back reflection layer (the transparent conductive layer) in a thin film photoelectric conversion device.

FIG. 5(A) is a graph showing the interrelation between the film-forming conditions for forming a zinc oxide back reflection layer and the reflectivity of the obtained back reflection layer.

FIG. 5(B) is a graph showing the interrelation between the film-forming conditions for forming a zinc oxide back reflection layer and the Jsc provided when the obtained back reflection layer was used.

FIG. 7 is a schematic diagram illustrating another sputtering apparatus suitable for the formation of the back reflection layer of the present invention.

FIG. 10(A) is a schematic view illustrating a magnet portion usable in the sputtering apparatus shown in FIGS. 7 or 8.

FIG. 10(B) is a schematic view illustrating another magnet portion usable in the sputtering apparatus shown in FIGS. 7 or 8.

DESCRIPTION OF THE PREFERRED EMBODIMENTS OF THE INVENTION

Figure 2:
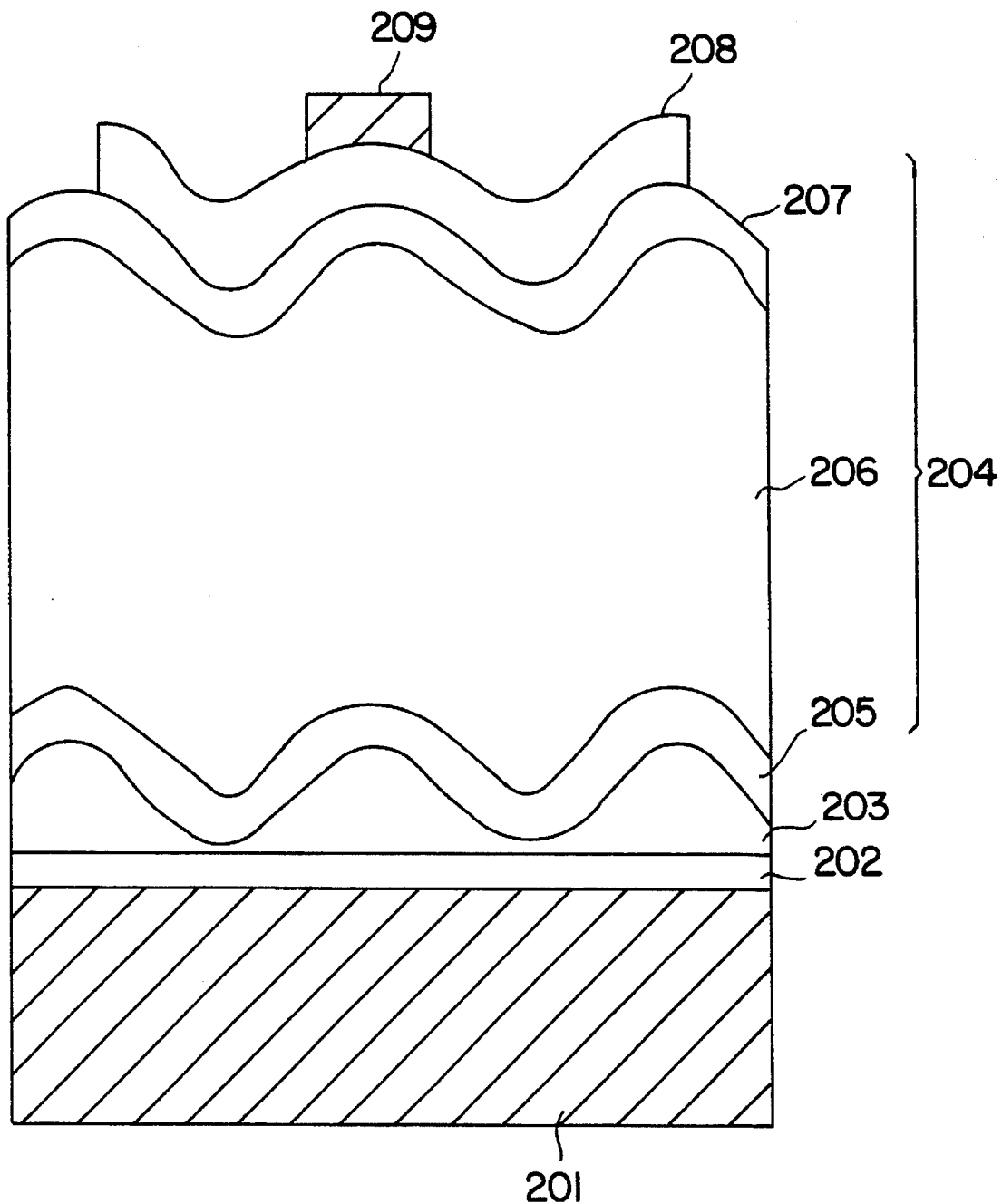
FIG. 2 is a schematic cross-sectional view illustrating the configuration of another example of a photoelectric conversion device according to the present invention.
Figure 3A:
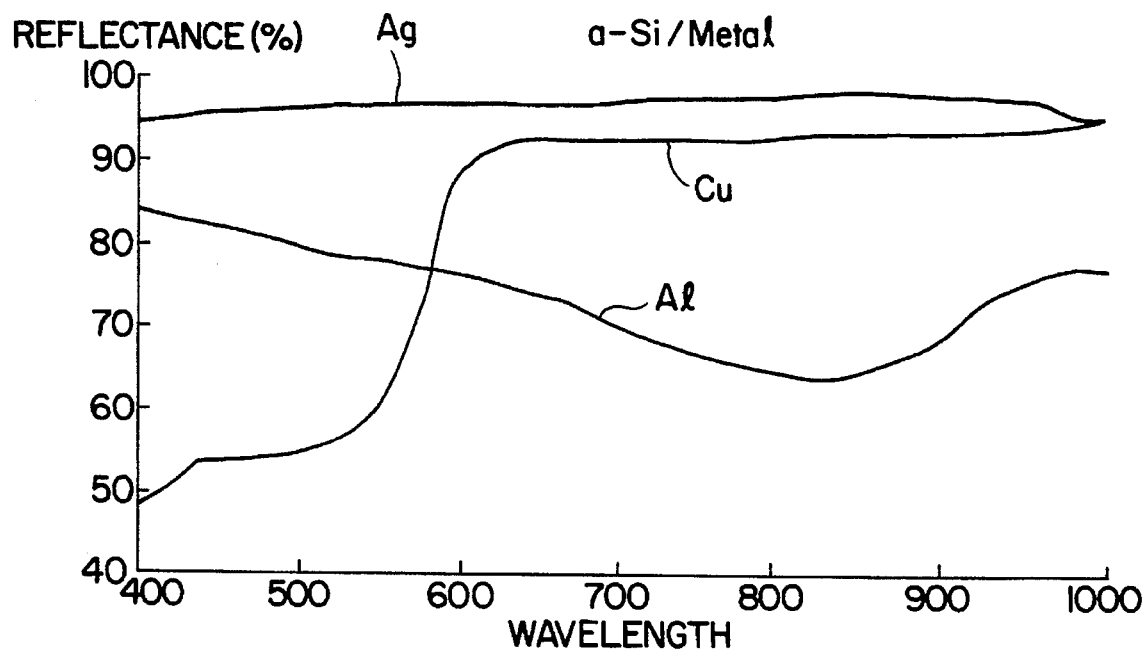
FIG. 3(A) is a graph showing measured results of the reflectance of each of the metals Ag, Cu, and Al as the metal layer as a function of the wavelength of the incident light in a conventional a-Si thin film solar cell without a transparent conductive layer.
Figure 3B:
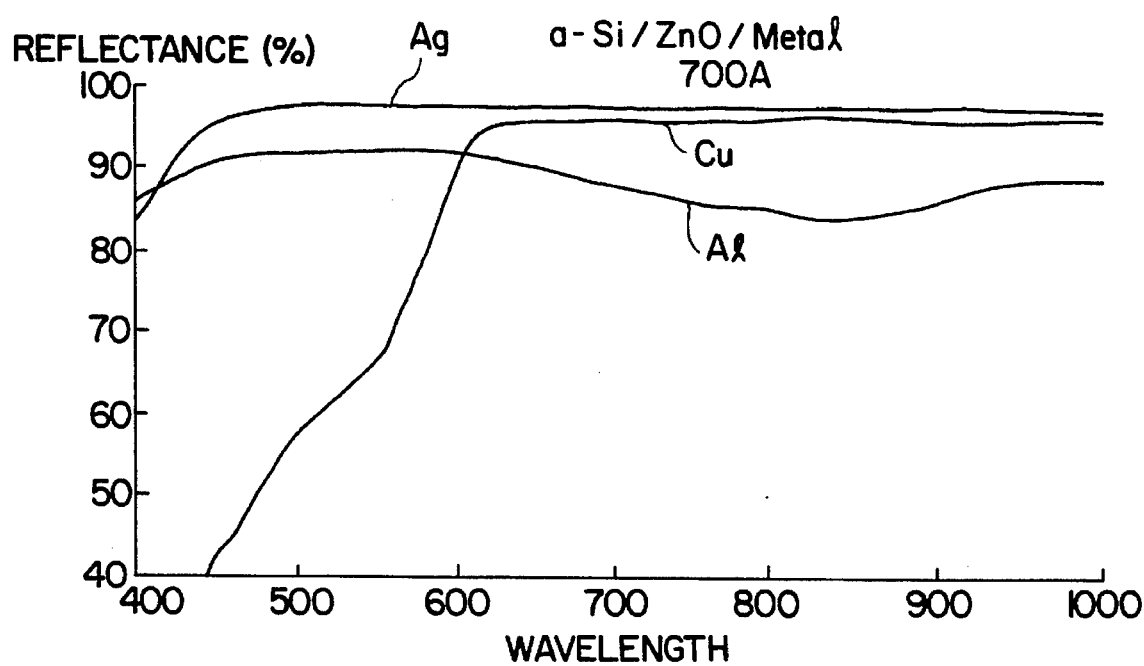
FIG. 3(B) is a graph showing measured results of the reflectance of each of the metals Ag, Cu, and Al as the metal layer as a function of the wavelength of the incident light in a conventional a-Si thin film solar cell with a transparent conductive layer.

In order to attain the above objects of the present invention, the present inventors made studies of the uneven structure at the surface of a back reflector (the term "back reflector" means a multi-layered region comprising a metal layer and a transparent conductive layer) in a thin film photoelectric conversion device (or a thin film solar cell). Description will be made with reference to FIG. 4(A) and FIG.(B).

Shown in FIG. 4(A) is a schematic view illustrating the constitution of a thin film photoelectric conversion device provided with a two-layered back reflector, wherein the substrate and transparent electrode are omitted for simplification purposes.

Particularly, the photoelectric conversion device shown in FIG. 4(A) comprises a substrate (not shown), a back reflector comprising a metal layer 401 and a transparent conductive layer 402, laminated in this order on the substrate, and a thin film active semiconductor layer 403 disposed on the back reflector.

It is known from the technical field of optical waveguides that when a thin film semiconductor having a refractive index n of greater than 1 is disposed such that one of the surfaces thereof is in contact with air and the remaining surface is in contact with a metal layer, the rays of light transmitted therein include radiation mode 404 in which the incident light is directly reflected and guided modes 405 and 406 in which the incident light is totally reflected at the surface of the semiconductor 403 and transmitted while being confined within the semiconductor. (If necessary, see Dietrich Marcuse, *THEORY OF DIELECTRIC OPTICAL WAVEGUIDES Second Edition*, Chapter 1, Published by ACADEMIC PRESS, INC. (1991).)

Now, the refractive index n of the thin film semiconductor material is about 3.4 when the constituent material is a-Si, about 3.5 to 3.8 when the constituent material is a-SiGe, and about 4.0 when the constituent material is GaAs. Thus, the refractive index of the thin film semiconductor 403 in any case is greater than that of the transparent conductive layer 402 (which is constituted by ZnO or SnO$_2$ having a refractive index of about 2). Therefore, in this configuration, there are two guided modes, i.e. a guided mode (1) (see, 405 in FIG. 4(A)) in which incident light is reflected at the surface of the metal layer 401 and another guided mode (2) (see, 406 in FIG. 4(A)) in which incident light is totally reflected at the interface between the thin film semiconductor 403 and the transparent conductive layer 402 and completely confined within the thin film semiconductor 403.

In view of the above, it is considered that a thin film photoelectric conversion device provided with such back reflector corresponds to a thin film optical waveguide. However, when the surface of each of the constituent layers is in the form of a uniform planar shape, as shown in FIG. 4(A), externally impinged light (that is, incident light) is of the foregoing three kinds of modes, which individually occur without converting into different modes. In the case of the radiation mode 404, the light is never confined within the laminate.

FIG. 4(B) is a modification of the configuration showing FIG. 4(A) in which each of the constituent layers, i.e., the metal layer 401, the transparent conductive region 402 and the thin film semiconductor layer 403 is designed to have a randomly roughened surface. In this configuration, the foregoing three kinds of modes do not individually occur as in the configuration shown in FIG. 4(A). That is, by virtue of the disturbing force due to the irregularity of the surface of each constituent layer, mutual interconversion occurs among the respective modes. For instance, the radiation mode (in which light is impinged perpendicularly to the substrate) is converted into the guided mode (see, 407 in FIG. 4(B)) and/or rays of light transmitted in the thin film semiconductor and the transparent conductive layer under the guided mode are externally radiated (see, 408 in FIG. 4(B)). When incident light is transmitted in the thin film semiconductor layer and the transparent conductive layer under the guided mode, the optical path length is substantially prolonged. Thus, even rays of light having a relatively small wavelength in terms of the absorption coefficient of the thin film semiconductor are significantly absorbed by the thin film semiconductor because of effects similar to those provided when the thin film semiconductor is made relatively thicker, resulting in providing an increase in the value of Jsc. However, in this case, an opposite effect entails in that rays of light confined in the guided mode are converted into the radiation mode. In addition, other opposite effects entail. That is, when rays of light are transmitted in the transparent conductive layer, they are absorbed by the transparent conductive layer, and/or absorbed by the metal layer, wherein a loss of incident light occurs.

Herein, the photoelectric conversion efficiency is a value proportional to Jsc (short-circuit current), and it can be expressed by the following equation:

photoelectric conversion efficiency=Jsc×Voc×F.F., with Voc being the open-circuit voltage, and F.F. being the fill factor.

Hence, in order to increase the Jsc, that is, in order to heighten the photoelectric conversion efficiency, it is effective (1) to increase the amount of conversion from the radiation mode in the guided mode, (2) to reduce the amount of conversion from the guided mode into the radiation mode, and (3) to prevent the loss of incident light which is caused by light absorption in the transparent conductive layer and/or the metal layer. The factors dominating these items include the refractive index, absorption coefficient, and thickness of the thin film semiconductor and the transparent conductive layer, and the refractive index, absorption coefficient, and uneven surface shape of the metal layer. Among these, the factors relating to the thin film semiconductor are limited in terms of freedom of variation because the factors are determined such that the thin film semiconductor has an optimum semiconductor junction capable of effectively exhibiting the most desirable electric characteristics for the photoelectric conversion. In addition, the factors relating to the metal layer are also limited in terms of the freedom of variation because it is necessary for the metal layer to be constituted by a specific metal having a high reflectance.

Further, the refractive indexes of the thin film semiconductor, the transparent conductive layer, and the metal layer are limited in terms of the freedom of variation because of the characteristics of the thin film semiconductor.

Based on the above findings, the present inventors studied whether the light absorption in the transparent conductive layer influences the Jsc (the short-circuit current) when the optical path length is prolonged, through the following experiments.

Experiment 1

In this experiment, various photoelectric conversion device samples of the configuration shown in FIG. 1 were prepared, and using these samples, studies were made of whether the light absorption in the transparent conductive layer is related to the Jsc.

Preparation of back reflector sample:

There were provided a plurality of well-cleaned stainless steel plates as the substrate 101. On the surface of each stainless steel plate, there was formed a 3000 Å thick Ag film having an uneven surface as the metal layer 102 by a conventional sputtering technique, wherein an Ag target was sputtered in an Ar gas atmosphere while maintaining the substrate 101 at a desired temperature capable of providing an uneven surface. Thus, there were obtained a plurality of intermediate laminates, each comprising the Ag film having an uneven surface as the metal layer 102 formed on the stainless steel plate as the substrate 101.

Then, on the uneven surface of the metal layer 102 of each intermediate laminate, there was formed a 5000 Å thick film composed of zinc oxide ($Zn_{1-x}O_x$ ($0<x<1$)) having an uneven surface conforming to the uneven surface of the Ag film as the transparent conductive layer 103 by a conventional reactive sputtering technique. The zinc oxide film for each intermediate laminate was different in terms of the composition ratio of the Zn and O. Particularly, the zinc oxide film for each intermediate laminate was formed by sputtering a Zn target in the sputtering chamber while flowing Ar gas at a fixed rate and $O_2$ gas at a different flow rate corresponding to 20 to 200% of the Ar gas in terms of the flow ratio into the sputtering chamber. Thus, there were obtained a plurality of back reflector samples.

Measurement of back reflector sample:

For each back reflector sample, the reflection spectrum was measured using a spectrophotometer model 330 (produced by Hitachi Ltd.), wherein a measurement was conducted for every 100 Å interval in wavelength in the range of 6000 to 10,000 Å in order to prevent occurrence of a periodical variation in reflectance due to interference effects occurring as a result of the change of the wavelength. Based on the measured values, there was obtained a mean value. The results are graphically shown in FIG. 5(A).

Preparation of photoelectric conversion device sample:

Using the above back reflector samples, there were prepared a plurality of photoelectric conversion device samples. That is, on the transparent conductive layer 103 of each back reflector sample, there was formed a 2300 Å thick pin junction semiconductor layer as the thin film semiconductor region 104, comprising a 200 Å thick n-type a-Si semiconductor layer 105, a 2000 Å thick i-type a-SiGe semiconductor layer 106 and a 100 Å thick p-type a-Si semiconductor layer 107 laminated in this order from the substrate side by a conventional RF glow discharge decomposition technique. Then, a transparent electrode 108 comprising a ITO film and a comb-shaped collecting electrode 109 comprising Ag were formed by conventional vacuum evaporation techniques. Thus, there were obtained a plurality of photoelectric conversion samples.

Evaluation of photoelectric conversion sample:

Each of the above photoelectric conversion devices was evaluated with respects to Jsc under a solar simulator having a AM-1.5 spectrum. The evaluated results obtained are graphically shown in FIG. 5(B).

The following discussion is based on the results shown in FIGS. 5(A) and 5(B). There were obtained the following findings. That is, (i) the Jsc of the photoelectric conversion devices is increased as the content of the $O_2$ gas in the atmosphere in the sputtering chamber upon forming the transparent conductive layer comprising a zinc oxide is increased to a certain extent, (ii) the Jsc of the photoelectric conversion devices is decreased as the content of the $O_2$ gas in the atmosphere in the sputtering chamber during formation of the transparent conductive layer comprising a zinc oxide is further increased to a degree greater than that in the case (i). However, (iii) the change in the reflectance of the transparent conductive layer does not always correspond to such tendency in terms of the Jsc of the final product, i.e., the photoelectric conversion device, and (iv) the photoelectric conversion device in which the transparent conductive layer comprised of a specific zinc oxide formed at a specific content of the $O_2$ gas in the gas atmosphere in the sputtering chamber shows a maximum value of Jsc but the reflectance of the transparent conductive layer does not vary in a corresponding manner. Thus, it is difficult to evaluate any zinc oxide film when it is situated as the transparent conductive layer of the back reflector in terms of the interrelation between the zinc oxide film and the Jsc of the final product, i.e., the photoelectric conversion device.

Experiment 2

In this experiment, various photoelectric conversion device samples of the configuration shown in FIG. 2 were prepared, and using these samples, studies were made of whether the light absorption in the transparent conductive layer is related to the Jsc.

Preparation of back reflector sample:

There were provided a plurality of well-cleaned stainless steel plates as the substrate 201. On the surface of each stainless steel plate, there was formed a 1000 Å thick Ag film having a flat surface as the metal layer 202 by a conventional sputtering technique, wherein an Ag target was sputtered in an Ar gas atmosphere. Thus, there were obtained a plurality of intermediate laminates, each comprising an Ag film having a flat surface as the metal region 202 formed the stainless steel plate as the substrate 201.

Then, on the flat surface of the metal layer 202 of each intermediate laminate, there was formed a film composed of zinc oxide ($Zn_{1-x}O_x$ (0<x<1)) having a slightly greater thickness than 5000 Å and having a flat surface as a transparent conductive region by a conventional reactive sputtering technique. The zinc oxide film of each intermediate laminate was different in terms of the composition ratio of the Zn and O. Particularly, the zinc oxide film for each intermediate laminate was formed by sputtering a Zn target in the sputtering chamber while flowing Ar gas at a fixed flow rate and $O_2$ gas at a different flow rate corresponding to 20 to 200% of the Ar gas in terms of the flow ratio into the sputtering chamber. Then, the zinc oxide film of each intermediate laminate was subjected to etching treatment using an etching liquid containing acetic acid to thereby form irregularities each having a substantially equal height. The thickness of the resulting zinc oxide film 203 was 5000 Å in terms of the mean value. Thereafter, the resultant was washed with water, followed by air drying. Thus, there were obtained a plurality of back reflector samples.

Measurement of back reflector sample:

For each back reflector sample, the reflection spectrum was measured as in Experiment 1. The results are graphically shown in FIG. 6(A).

Preparation of photoelectric conversion device sample:

Using the above back reflector samples, there were prepared a plurality of photoelectric conversion device samples. That is, on the transparent conductive layer 203 of each back reflector sample, there was formed a 2300 Å thick pin junction semiconductor layer as the thin film semiconductor region 104, comprising a 200 Å thick n-type a-Si semiconductor layer 105, a 2000 Å thick i-type a-SiGe semiconductor layer 106 and a 100 Å thick p-type a-Si semiconductor layer 107 laminated in this order from the substrate side by a conventional RF glow discharge decomposition technique. Then, a transparent electrode 108 comprising an ITO film and a comb-shaped collecting electrode 109 comprising Ag were formed by conventional vacuum evaporation techniques. Thus, there were obtained a plurality of photoelectric conversion samples.

Evaluation of photoelectric conversion sample:

Each of the above photoelectric conversion devices was evaluated with respect to Jsc under a solar simulator having a AM-1.5 spectrum. The results are graphically shown in FIG. 6(B).

Figure 6A:
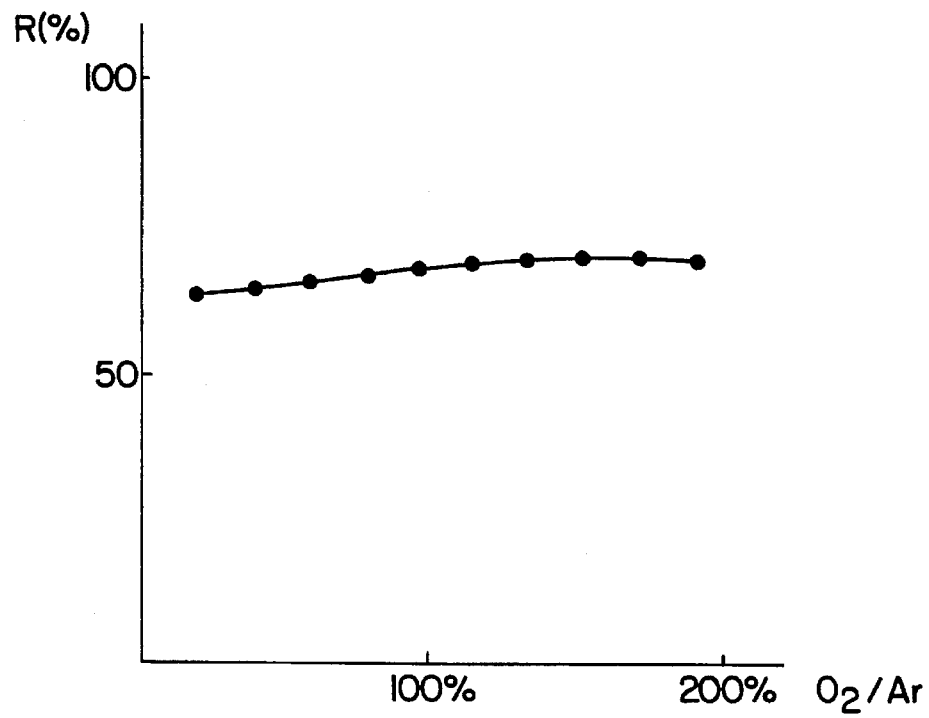
FIG. 6(A) is a graph showing the interrelation between the film-forming conditions for forming another zinc oxide back reflection layer and the reflectivity of the obtained back reflection layer.
Figure 6B:
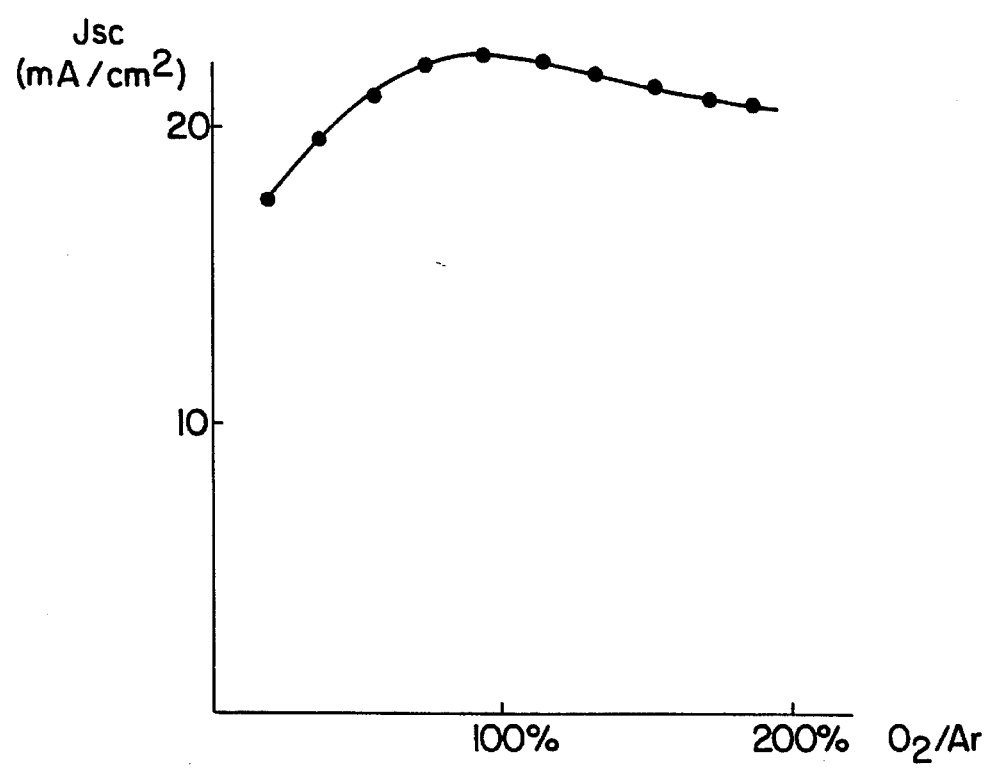
FIG. 6(B) is a graph showing the interrelation between the film-forming conditions for forming another zinc oxide back reflection layer and the Jsc provided when the obtained back reflection layer was used.

The following discussion is based on the results shown in FIGS. 6(A) and 6(B). There were obtained findings similar to Experiment 1. Particularly, as in Experiment 1, the photoelectric conversion device in which the transparent conductive layer is comprised of a specific zinc oxide film formed at a specific content of the $O_2$ gas in the gas atmosphere in the sputtering chamber shows a maximum value in Jsc, but the reflectance of the transparent conductive region does not correspondingly vary. Thus, it is difficult to evaluate any zinc oxide film when it is situated as the transparent conductive layer of the back reflector in terms of the interrelation between the zinc oxide film and the Jsc of the final product, i.e., the photoelectric conversion device.

Experiment 3

In view of the results in Experiments 1 and 2, in order to examine the zinc oxide films as the transparent conductive layer used in Experiment 1 with respect to film structure and chemical composition, there were prepared a plurality of zinc oxide film samples by repeating the procedures of Experiment 1, except that a No. 7059 glass plate (produced by Corning Company) was used as the substrate, no metal region was formed, and the ratio of $O_2$ gas/Ar gas in the sputtering chamber during film formation was as shown in Table 1(A).

Each of the resultant zinc oxide film samples was evaluated in the following manner. That is, each zinc oxide film sample was placed in commercially available MXP18 type X-ray diffractometer (produced by MAC Science Company), wherein its diffraction peak was examined using a CuKα ray.

In the X-ray diffraction measurement, a specimen is positioned at a given angle θ to incident X-rays, and the intensity of the X-rays diffracted from the specimen is measured. When the specimen is of a polycrystalline structure, the X-rays are strongly diffracted in the direction of an angle 2θ versus the incident ray angle θ to correspond to the spacing d of the crystal lattice planes. When the wavelength of the X-rays used is (in the above diffractometer) λ=1.541

Å, the following Bragg's formula is established between d and θ:

$$2d \times \sin\theta = \lambda.$$

Thus, when θ is measured, d (the spacing of crystal lattice planes) can be obtained and it is possible to determine the crystallinity of the specimen.

Each sample was subjected to X-ray diffraction measurement in the above X-ray diffractometer. There were found various diffraction peaks. There were also observed a number of diffraction patterns having a narrow half-width apparently corresponding to a polycrystalline structure and other diffraction patterns having a relatively wider half-width apparently corresponding to microcrystalline structure. The spacing of the crystal lattice planes corresponding to each diffraction peak was examined based on the above Bragg's formula. It was found that for all of the samples, almost all diffraction peaks corresponded to those for the spacing of crystal lattice planes of ZnO crystals registered in the ASTM (American Society For Testing Materials) diffraction data card. For instance, the diffraction peak which appeared at 2θ was found to be of d=2.746 Å corresponding to the (0,0,2) lattice planes of ZnO crystal. However, for some of the samples, there were found diffraction peaks which could not be distinguished based on the foregoing spacing of crystal lattice planes of ZnO crystal registered in the ASTM card. Particularly, for some of the samples, there was found a diffraction peak of 2θ=37.00° (corresponding to d=2.428), and for some of the samples, there was found a diffraction peak of 2θ=43.24° (corresponding to d=2.019). Each of these two diffraction peaks is clearly different from the diffraction peak corresponding to ZnO crystals and the heights of these two diffraction peaks varied depending upon the film-forming conditions.

By referring to the above ASTM card, examination was made of crystals other than the ZnO crystal. The diffraction peak of 2θ=37.00 corresponded to the (2,0,0) lattice planes of $ZnO_2$ crystal and the diffraction peak of 2θ=43.24 corresponded to the (2,0,0) lattice planes of Zn crystal.

The intensities of the above two diffraction peaks are shown in Table 1(A), wherein each value shown is a value relative to the diffraction peak intensity of the (0,0,2) plane of the ZnO.

Separately, there were prepared a plurality of photoelectric conversion devices by repeating the procedures of Experiment 1, except that the zinc oxide film as the transparent conductive layer for each photoelectric conversion device was formed in the same manner as the corresponding zinc oxide film in the above. Each of the resultant devices was evaluated with respect to Jsc, open circuit voltage (Voc), fill-factor (F.F.) and photoelectric conversion efficiency (η). The results are collectively shown in Table 1(A).

Based on the results shown in Table 1(A), the following findings were obtained. That is, (i) the peak intensity for Zn is increased when the proportion of the $O_2$ gas versus the Ar gas is 80% of less, and along with this, the Jsc is decreased, wherein the F.F. is increased when the proportion of the $O_2$ gas versus the Ar gas is 90% or less; and (ii) the peak intensity for $ZnO_2$ is increased when the proportion of the $O_2$ gas versus the Ar gas is 120% or above, and along with this, the Jsc is decreased, wherein the Voc is increased when the proportion of the $O_2$ gas versus the Ar gas is 110% or above. Based on these findings, it was found that where the zinc oxide film is such that a diffraction peak intensity for Zn can be detected, fine Zn crystal grains are present in the film, and because of this, light absorption is increased.

Incidentally, it is known that the ZnO crystal is colorless but that of $ZnO_2$ exhibits a pale yellow color (if necessary, see *Chemical Handbook,* Basis Section I, page 203, edited by Japan Chemical Society).

In view of this, it is understood that light absorption by the zinc oxide film is increased as the content of $ZnO_2$ therein is increased.

Optimum reflectivity of a given zinc oxide film as the transparent conductive layer could not be determined in Experiments 1 and 2 because the light rays of the foregoing guided mode 405 (confined between the surface of the thin film semiconductor and the metal region), as the optical path length are greatly prolonged (as much as 10 times or above over the thickness of the zinc oxide film), the influence due to the light absorption was liable to appear and a distinguishable influence due to the guided mode could not be recognized by the measurement of the reflectance of the back reflector sample. Hence, no significant difference appeared. In addition, when different crystal grains are present in the zinc oxide film, the light rays of the guided mode are scattered and this provides an influence.

It was found that the influences due to light absorption and scattering are not directed to the reflectances shown in FIGS. 5(A) and 6(A) because the mode under which light is transmitted varies to increase the light confining effect depending upon whether the thin film semiconductor 403 was stacked on the transparent conductive layer 402. As a result, the influence due to light absorption by the zinc oxide film of the transparent conductive layer became significant.

The evaluation of loss in incident light due to light absorption by the zinc oxide film of the transparent conductive layer can be more effectively conducted by the technique of X-ray diffraction measurement.

As is apparent from Table 1(A), not only the Voc but also the F.F. vary depending upon the conditions for the formation of the zinc oxide film. As a result of further studies by the present inventors, it was found that there is an interrelation between said variation in terms of the Voc and F.F. and the ratio of the diffraction peak intensity of Zn and/or $ZnO_2$ versus that of ZnO. That is, when the zinc oxide film has been formed by making the proportion of the $O_2$ gas versus the Ar gas relatively small and the ratio of the diffraction peak intensity for Zn versus that for ZnO relatively high, the F.F. is improved. To explain this, the present inventors examined the surface structure of such zinc oxide films by means of a scanning electron microscope. The zinc oxide film was found to have a surface provided with minute spherical smooth protrusions. It was also found that when the zinc oxide film has no diffraction observed for Zn, such film is inferior in terms of surface smoothness to the film for which a diffraction peak is observed. Since the thin film active semiconductor layer is laminated on the zinc oxide film and the surface of the film is smoothed as much as possible, unevenness in the electric field is decreased and the charge transport properties are improved, resulting in an improvement in the F.F. In addition, when the zinc oxide film has been formed by making the proportion of the $O_2$ gas versus the Ar gas relatively large and the ratio of the diffraction peak intensity for $ZnO_2$ versus that for ZnO relatively high, it was found that the Voc improved. The reason for this effect is not clear at the present time. But lamination of such specific zinc oxide film on the thin film active semiconductor layer would provide an additional electromotive force.

Based on the findings above, it was determined that desirable zinc oxide films capable of providing an optimum Jsc can be selectively obtained by measuring the ratios of specific peak intensities obtained by X-ray diffraction. When the transparent conductive layer of the back reflector is constituted by a specific zinc oxide film having a diffraction pattern of CuKα rays in which (a) the peak intensity of the (2,0,0) planes of $ZnO_2$ is 1/200 or less of (b) the peak intensity of the (0,0,2) planes of ZnO and (c) the peak intensity of the (1,0,1) planes of Zn is 1/200 or less of the peak intensity (b), a substantially optimum Jsc is provided.

Further, based on the results shown in Table 1(A), it was found that photoelectric conversion efficiency (η) improved when the zinc oxide film has a value of 0.005 or less in terms of either the ratio of the diffraction peak intensity of Zn versus that of ZnO or the ratio of the diffraction peak intensity of $ZnO_2$ versus that of ZnO, and especially when the zinc oxide film has a value substantially greater than zero in terms of both the ratio of the diffraction peak intensity of Zn versus that of ZnO and the ratio of the diffraction peak intensity of $ZnO_2$ versus that of ZnO.

Each of the photoelectric conversion devices was evaluated with respect to durability under severe environments. Each device was allowed to stand under severe environments of 85° C. and 85% relative humidity for 20 hours and thereafter its Jsc was examined.

The results are collectively shown in Table 1(B), in which the initial Jsc of each of the photoelectric conversion devices shown in Table 1(A) is also shown.

Based on the results shown in Table 1(B), it was found that when the proportion of the $O_2$ gas versus the Ar gas is 100%, there is a distinguishable difference between the initial Jsc and the Jsc after the durability test. When the proportion of the $O_2$ gas versus the Ar gas is in the range of 40 to 80% and in the range of 120 to 160%, there is no substantial difference between the initial Jsc and the Jsc after the durability test. The reasons for this is not clear at the present time, but when the zinc oxide film contains microcrystals of Zn and/or $ZnO_2$, a certain influence is afforded to the ZnO crystal structure such that the photoelectric conversion device provided with such zinc oxide film is compatible with external conditions of environmental temperature and/or humidity. When the zinc oxide film contains an excessive amount of microcrystals of Zn and/or $ZnO_2$, the ZnO crystal structure apparently becomes unstable, whereby the photoelectric conversion devices provided with such zinc oxide films are poor in stability against environmental changes upon use over a long period of time.

The present inventors also conducted studies of the content of Zn and $ZnO_2$ contained in the zinc oxide film in the following manner.

There were provided a plurality of test samples, each comprising a mixture of powdery ZnO, powdery Zn in a different amount, and powdery $ZnO_2$ in a different amount. Each test sample was subjected to X-ray diffraction as previously described to examine the ratio of the diffraction peak intensity of Zn versus that of ZnO and the ratio of the diffraction peak intensity of $ZnO_2$ versus that of ZnO. Based on the results, there was prepared a calibration curve which enables examination of the interrelations between the powdery mixtures having a different mixing ratio of each of the Zn and $ZnO_2$ and their ratios in terms of the above diffraction peak intensities.

Based on the calibration curve, it was found that a value of 0.005 in terms of the diffraction peak intensity ration of Zn/ZnO indicates 400 ppm as the content of Zn and a value of 0.002 in terms of the diffraction peak intensity ratio of Zn/ZnO indicates 150 ppm as the content of Zn. It was also found that a value of 0.005 in terms of the diffraction peak intensity ratio of $ZnO_2$/ZnO indicates 600 ppm as the content of $ZnO_2$ and a value of 0.002 in terms of the diffraction peak intensity ratio of $ZnO_2$/ZnO indicates 250 ppm as the content of $ZnO_2$.

With reference to these findings, it was determined that the amount of Zn contained in the ZnO is desired to be in the range of 150 to 400 ppm and the amount of $ZnO_2$ contained in ZnO is desired to be in the range of 250 to 600 ppm.

The present invention was based on the above findings. In the following, description will be made of each of the constituents of the photoelectric conversion device according to the present invention.

Substrate and Metal Region

The substrate can include various metals and alloys of those metals. Specific examples are stainless steel, galvanized steel, aluminum, copper, and the like which are obtainable at a relatively inexpensive cost. The substrate may be of any configuration such as plate-like or belt-like shape, depending upon the application uses. In the case of continuously producing a photoelectric conversion device according to the present invention, the substrate may have a web-like shape. Other than the above metal members, the substrate may be made of glass or ceramics depending upon the application uses.

The substrate may be subjected to surface treatment to have a ground surface. In the case of a stainless steel member applied with bright-annealing treatment to the surface, it can be used as is as the substrate.

In the case where a metal member having a relatively small reflectance such as stainless steel plate or galvanized steel is used as the substrate, it may be deposited on the surface thereof with a metal having a high reflectance such as Ag or Al. In this case, if the metal film thus deposited is used as the metal layer of the back reflector, as the shorter wavelength components in the spectrum of the incident light will have been already absorbed by the thin film active semiconductor region, it is sufficient for the metal film to be high enough in terms of the reflectance of light having a longer wavelength than said shorter wavelength light.

As for the metal layer of the back reflector, its reflectance in relation to the long wavelength light should be properly determined depending upon the light absorption coefficient and the thickness of the thin film active semiconductor layer. For instance, when the thin film active semiconductor layer is comprised of an a-Si material and has a thickness of 4000 Å, the long wavelength light involved is about 6000 Å. In this case, the metal layer may be composed of Cu.

In the case where the substrate is composed of a material having low electroconductivity such as glass or ceramics, it can be made usable by depositing a metal film as the metal layer on the surface thereof.

The deposition of such metal film can be by resistance heating vacuum deposition, electron beam vacuum deposition, sputtering, ion plating, CVD, or plating.

In the following, description will be made of depositing a metal film as the metal layer on a substrate by means of a sputtering apparatus.

FIG. 7 is a schematic diagram of an example of the sputtering apparatus usable in this case. In the figure, reference numeral 701 indicates a vacuum chamber which is provided with an exhaust pipe connected through an exhaust valve 703 to a vacuum pump (not shown). Reference numeral 7O2 indicates a gas feed pipe extending from a gas reservoir (not shown) containing an inert gas such as Ar gas. Reference numeral 704 indicates a substrate positioned on the surface of an anode 706 provided with an electric heater 705 for heating the substrate installed inside. Reference numeral 708 indicates a cathode electrically connected to a power source 709. Reference numeral 707 indicates a target positioned on the surface of the cathode 708 such that it opposes the substrate 704. The target 707 comprises a metal block dedicated for film formation. The metal block usually comprises a metal of 99.9% to 99.999% in purity. If necessary, the metal block may contain given impurities.

For film formation by this sputtering apparatus, the power source 709 is switched on to apply a high voltage of radio frequency (RF) or direct current (DC) to generate plasma between the cathode 708 and the anode 706 while supplying inert gas such as Ar gas into the deposition chamber 701 through the gas feed pipe 702, whereby the target 707 is sputtered with the plasma generated to cause the deposition of a metal film on the substrate 704.

The cathode 708 may be provided with a magnet (not shown) installed in the inside thereof. In this case, the sputtering apparatus functions as a magnetron sputtering apparatus wherein the deposition rate of the film deposited is increased.

In the following experiment (Experiment 4), an example wherein a metal film as the metal layer was formed using the above sputtering apparatus will be described.

Experiment 4

As the target 707, there was used an Al target of 99.99% in purity and of 6 inches in diameter. As the substrate 704, there was used a stainless steel plate (SUS 430, under the JIS standard) of 1 mm in thickness and 5 cm×5 cm in size. The distance between the substrate and the target in the deposition chamber was set at 5 cm. The inner pressure of the vacuum chamber was maintained at a vacuum of 1.5 mTorr while introducing Ar gas at a flow rate of 10 sccm. The power source 709 was switched on to apply a DC voltage of 500 V to cause glow discharge, wherein plasma was generated between the substrate and the target, and an electric current of 2 amperes flowed. The glow discharging was continued for 1 minute, whereby an Al film was deposited on the substrate. During the film formation, the substrate temperature was varied to 100° C., 200° C., then 300° C. It was found that the surface of the Al film can have an even surface structure or an uneven surface structure by controlling the substrate temperature during film formation.

The above procedures were repeated for other kinds of metal targets to obtain various metal films. As a result, it was found that the surface of any of these films can have an even surface structure or an uneven surface structure by controlling the substrate temperature during film formation.

Transparent and Conductive Region and Uneven Surface Structure Thereof

As has been previously described, as for the light permeability of the transparent conductive layer, the higher it is, the better. It is not necessary for this condition to be established for light having a wavelength which is sufficiently absorbed by the thin film active semiconductor layer and for light having a wavelength which is completely unabsorbed by the thin film active semiconductor layer. Particularly, it is sufficient as long as this condition is established for light having a wavelength of 6000 to 8500 Å when the thin film active semiconductor layer is composed of an a-Si material, and for light having a wavelength of 6500 to 10,000 Å in the case where the thin film active semiconductor layer is composed of an a-SiGe material.

The transparent conductive layer is preferred to have a certain resistivity in order to prevent electric current flow due to defects such as pinholes. However, the resistivity is necessary to the extent that the series resistance loss due to the resistivity does not substantially negatively influence the photoelectric conversion efficiency of the photoelectric conversion device. In view of this, the transparent conductive layer is desired to have a resistivity preferably in the range of $1\times10^{-5}$ to $1\times10^{2}$ $\Omega/cm^2$, more preferably in the range of $1\times10^{-4}$ to $3\times10$ $\Omega/cm^2$, most preferably in the range of $1\times10^{-3}$ to $1$ $\Omega/cm^2$.

The transparent conductive layer may be formed by resistance heating vacuum deposition, electron beam vacuum deposition, sputtering, ion plating, CVD, or spray coating.

As a result of the experimental studies of the present inventors, it was found that a desirable zinc oxide film excelling in characteristics which is suitable for use as the transparent conductive layer according to the present invention can be formed by using the sputtering or vacuum deposition process and optimizing the film-forming conditions.

In the following, description will be made of forming a zinc oxide film constituting the transparent conductive layer according to the present invention by the sputtering process. The film formation can be conducted by the sputtering apparatus shown in FIG. 7.

As the target 707, there can be used a ZnO target or a Zn target. In the case of using the Zn target, the reaction system is based on the reactive sputtering process. Thus, it is necessary to introduce not only Ar gas but also an oxygen-containing gas such as $O_2$ gas, $H_2O$ gas, NO gas, $NO_2$ gas, CO gas, $CO_2$ gas, or $CH_3OH$ gas into the deposition chamber 701. In this case, to control the resistivity of the obtained zinc oxide film, a Zn target containing a dopant such as Al, Cu, or the like is used.

In the sputtering apparatus, the cathode 708 is provided with a magnet mechanism of the configuration shown in FIG. 10(A) or 10(B) capable of centralizing plasma generated in the vicinity of the surface of the target 707 during film formation. The sputtering apparatus in this case becomes a so-called magnetron sputtering apparatus. The film-forming process using this magnetron sputtering apparatus accordingly becomes a so-called magnetron sputtering process.

Herein, description will be made of the magnet mechanism shown in FIG. 10(A) or 10(B). Reference numeral 1001 indicates a target which is fixed onto the surface of a backing plate 1002 having good thermal conductivity, comprising Cu for example. Reference numeral 1005 indicates a yoke plate having a pair of magnetic poles 1003 and 1004 concentrically arranged on the surface thereof. The yoke plate 1005 is fixed to the rear face of the backing plate $100_2$ through the pair of magnetic poles. In the magnet mechanism thus structured, magnetic lines of force 1006 are generated between the pair of magnetic poles 1003 and 1004, wherein a tunnel in which magnetic lines of force are confined is formed on the target 1001 surface since the pair of magnetic poles 1003 and 1004 are concentrically arranged. Upon film formation, the plasma generated is confined in the tunnel and as a result, the target 1001 is effectively sputtered with the plasma.

Experiments 5 and 6

These experiments were conducted to obtain a high quality zinc oxide film suitable for use as the transparent conductive layer of a photoelectric conversion device according to the present invention, based on the knowledge obtained in Experiment 3.

Experiment 5

There were prepared a plurality of back reflector samples, each comprising a metal film as the metal layer and a zinc oxide film as the transparent conductive layer.

In the formation of each back reflector sample, there was formed an Ag film having an uneven surface as the metal layer on the surface of a stainless steel plate (SUS 430 under the JIS Standard) of 1 mm in thickness and 5 cm×5 cm in size and having a ground surface as the substrate in the same manner as in Experiment 4. Then, a zinc oxide film was formed as the transparent conductive layer on the uneven surface of the Ag film as the metal layer by the reactive sputtering process using the above magnetron sputtering apparatus. Particularly, in the formation of the zinc oxide film, a Zn target (purity: 99.99%) of 6 inches in diameter was used, the distance between the substrate and the target was 5 cm, Ar gas and $O_2$ gas were fed into the deposition chamber at respective flow rates of 10 sccm and 10 sccm, the inner pressure of the deposition chamber was maintained at 1.0 mTorr and the substrate was maintained at a given temperature. Then, a given DC voltage was applied, whereby glow discharge produced plasma between the substrate and the target, and an electric current of 1 AMP flowed. The glow discharging was continued for 5 minutes. These procedures were repeated, except that the substrate temperature was varied in the range of 100° to 450° C. and the flow rate of the $O_2$ gas was adjusted as shown in Table 2, to thereby obtain a plurality of back reflector samples.

As for the zinc oxide film of each back reflector sample, its X-ray diffraction pattern was examined as in Experiment 3. The results are shown in Table 2.

Based on the results shown in Table 2, there were obtained the following findings. That is, (i) both the ratio between the diffraction peak intensity of Zn and that of ZnO and the ratio between the diffraction peak intensity of $ZnO_2$ and that of ZnO are changed depending upon a change in the substrate temperature; (ii) by increasing the flow rate of the $O_2$ gas when the substrate temperature is lowered, or by decreasing the flow rate of the $O_2$ gas when the substrate temperature is increased, both the ratio between the diffraction peak intensity of Zn and that of ZnO and the ratio between the diffraction peak intensity of $ZnO_2$ and that of ZnO can be improved to 0.005 or less at the substrate temperature in the range of 150° to 350° C.; and (iii) however, when the substrate temperature is less than 100° C. or beyond 350° C., the ratio between the diffraction peak intensity of Zn and that of ZnO and the ratio between the diffraction peak intensity of $ZnO_2$ and that of ZnO cannot be made to be 0.005 or less even by adjusting the flow rate of the $O_2$ gas.

Experiment 6

There were prepared a plurality of back reflector samples, each comprising a metal film as the metal layer and a zinc oxide film as the transparent conductive layer.

In the formation of each back reflector sample, there was formed an Ag film having an uneven surface as the metal layer on the surface of a stainless steel plate (SUS 430 under the JIS Standard) of 1 mm in thickness and 5 cm×5 cm in size and having a ground surface as the substrate in the same manner as in Experiment 4. Then, a zinc oxide film was formed as the transparent conductive later on the uneven surface of the Ag film as the metal layer by the reactive sputtering process using the above magnetron sputtering apparatus. Particularly, in the formation of the zinc oxide film, a Zn target (purity: 99.99%) of 6 inches in diameter was used as the target, the distance between the substrate and the target was 5 cm, Ar gas and $O_2$ gas were flowed into the deposition chamber at respective flow rates of 10 sccm and 10 sccm, the inner pressure of the sputtering chamber was maintained at a given vacuum degree and the substrate was maintained at a temperature of 250° C. A given DC voltage was applied, wherein glow discharge produced plasma between the substrate and the target and an electric current of 1 AMP flowed. The glow discharging was continued for 5 minutes. These procedures were repeated, except that the inner pressure of the sputtering chamber was varied in the range of 0.5 to 20.0 mTorr and the magnet mechanism was used or not used, to thereby obtain a plurality of back reflector samples.

As for the zinc oxide film of each back reflector sample, its X-ray diffraction pattern was examined as in Experiment 3. The results are shown in Table 3.

Based on Table 3, there were obtained the following findings. That is, (i) when no magnet mechanism was used, glow discharge is not caused at an inner pressure of 2.0 mTorr or below, and at an inner pressure of 3.0 mTorr or above, although glow discharge is caused, there cannot be formed a desirable zinc oxide film; and (ii) when the magnet mechanism is used, glow discharge is not caused at an inner pressure of 0.5 mTorr or below, but at an inner pressure of 0.75 mTorr or above, glow discharge is caused, and at an inner pressure in the range of 0.75 to 3.0 mTorr, there can be formed a desirable zinc oxide film.

The ratio between the diffraction peak intensity of Zn and that of ZnO and the ratio between the diffraction peak intensity of $ZnO_2$ and that of ZnO change depending upon a change in the substrate temperature because zinc atoms (Zn) and oxygen atoms (0) deposited on the surface of the substrate suffer from the influence of the substrate temperature.

That is, when substrate temperature is relatively lower, the reaction between the Zn and O becomes insufficient, whereby sufficient O is not incorporated into the network of zinc oxide, and part of the Zn left without being reacted with the O is crystallized as metallic Zn. When the substrate temperature is relatively higher, the reaction between the Zn and O is excessively facilitated to cause the formation of $ZnO_2$ in an excessive amount. When the inner pressure is relatively lower, the reaction between the Zn and O occurs mainly on the substrate, but as the inner pressure is increased, the reaction occurs in the vapor phase. In the vapor phase, coagulation or excessive oxidation of the Zn becomes liable to occur and because of this, the resulting zinc oxide film increases in terms of the diffraction peak intensity of Zn and also the diffraction peak intensity of ZnO. Further, in the case of the magnetron sputtering process, plasma is centralized in the vicinity of the target, but when the magnet mechanism is omitted, plasma is extended also to the substrate side, and this negatively influences the reaction between the Zn and O on the substrate.

Separately, the present inventors prepared a plurality of back reflector samples in addition to the above, by the reactive vacuum deposition process, wherein the substrate temperature and the inner pressure during film formation were varied as in the above. As for the zinc oxide film of each back reflector, its X-ray diffraction pattern was examined as in Experiment 3. It was found when the substrate temperature is in the range of 100° to 250° C., the ratio between the diffraction peak intensity of Zn and that of ZnO and the ratio between the diffraction peak intensity of $ZnO_2$ and that of ZnO can be optimized by controlling the pressure of the $O_2$ gas depending upon the substrate temperature in said range. As for the inner pressure upon film formation, it was found that 0.5 mTorr is optimum when the substrate temperature is 100° C., and 0.2 mTorr is optimum when the substrate temperature is 250° C. Further, no optimum condition in terms of the inner pressure was found when the substrate temperature is less than 100° C. or beyond 250° C.

Experiment 7

The present inventors found that by giving the zinc oxide film as the transparent conductive layer an uneven surface, it is possible to effectively confine incident light even when the surface of the metal layer is flat. The surface of the zinc oxide film as the transparent conductive layer becomes uneven when the substrate temperature during film formation increases.

In this experiment, there were prepared a plurality of back reflector samples each comprising a metal film having a flat surface as the metal layer and a specific zinc oxide film having an uneven surface as the transparent conductive layer formed on the flat surface of the metal layer. Using each back reflector sample, there was prepared a photoelectric conversion device.

Preparation of back reflector sample:

There were prepared a plurality of back reflector samples by forming a 600 Å thick Ag film having a flat surface as the metal layer on the surface of a stainless steel plate (SUS 430 under the JIS Standard) of 1 mm in thickness and 5 cm×5 cm in size and having a ground surface as the substrate as in Experiment 4. Then, a 1 μm thick zinc oxide film having an uneven surface was formed as the transparent conductive layer on the flat surface of the Ag film as the metal layer by the reactive sputtering process using the above magnetron sputtering apparatus. Particularly, in the formation of the zinc oxide film having an uneven surface, a Zn target (purity: 99.99%) of 6 inches in diameter was used, the distance between the substrate and the target was 5 cm, Ar gas and $O_2$ gas were fed into the deposition chamber at respective flow rates of 10 sccm and 10 sccm, the inner pressure of the deposition chamber was maintained at 1.0 mTorr and the substrate was maintained at a given temperature. A given DC voltage was applied whereby glow discharge produced plasma between the substrate and the target, thereby forming a zinc oxide film having an uneven surface. These procedures were repeated, except that the substrate temperature was changed to 150° C., 250° C., and 300° C., to obtain a plurality of back reflector samples.

As for the zinc oxide film of each back reflector sample, its X-ray diffraction pattern was examined as in Experiment 3. The results are shown in Table 4.

Preparation of photoelectric conversion device:

Using each back reflector sample, there were prepared a plurality of photoelectric conversion device samples by repeating the procedures of Experiment 1. Each of the resultant samples was evaluated with respect to Jsc as in Experiment 1. The results are shown in Table 4.

The present inventors originally considered that the irregularities formed at the surface of the zinc oxide film become greater in size as the substrate temperature during film formation increases and along with this, the effect of confining of the incident light increases to provide an improvement in the Jsc.

Based on the results shown in Table 4, it was found that there is a tendency that as the magnitude of the irregularity at the surface of the zinc oxide film as the transparent conductive layer is increased, the Jsc is increased accordingly and that a specific zinc oxide film containing, in addition to ZnO, a trace amount of Zn and/or $ZnO_2$ as the transparent conductive layer and having a surface with an increased irregularity serves to markedly improve its function as a constituent of a photoelectric conversion device.

As apparent from the above description, the specific zinc oxide film according to the present invention which enables one to obtain a desirable photoelectric conversion efficiency for a photoelectric conversion device can be formed by the magnetron sputtering process wherein the selected film-forming parameters are properly combined in terms of relative and organic relationships with each other. Specifically, those film-forming parameters basically include (i) to employ 3 mTorr or below for the inner pressure upon sputtering a given target in the sputtering chamber, (ii) to employ a temperature of 150° to 350° C. for the substrate temperature, (iii) to use a magnetron sputtering source, and (iv) to supply $O_2$ gas or an oxygen-containing compound gas at a desired flow rate upon sputtering the target. These film-forming parameters should be combined and optimized while giving due care to the magnetron sputtering source used and also the shape of a substrate used in relative and organic relationships for forming a desirable zinc oxide film.

The specific zinc oxide film according to the present invention can be also formed by means of a reactive vacuum deposition process wherein a Zn source is evaporated under conditions of maintaining the inner pressure at 0.5 mTorr or below, maintaining the substrate at a temperature of 100° to 250° C., and supplying $O_2$ gas or an oxygen-containing compound gas at a desired flow rate. In this case, it is important to combine and optimize these film-forming parameters while giving due care to the vacuum deposition gun used and also the shape of the substrate used in relative and organic relationships for forming a desirable zinc oxide film.

In the following, the present invention will be described in more detail with reference to examples, which are only for illustrative purposes and are not intended to restrict the scope of the invention.

Example 1

There were prepared 10 pin junction type a-Si photoelectric conversion devices of the configuration shown in FIG. 2, each designed such that the substrate 201 serves also as the metal layer 202. Each device was prepared as described below.

There was provided a well-cleaned copper plate of 1 mm in thickness and 5 cm×5 cm in size and having a ground surface as the substrate 201. The copper plate as the substrate 201 was introduced into the magnetron sputtering apparatus shown in FIG. 7 provided with the magnet mechanism shown in FIG. 10(A), positioned on the anode 706 as shown by the reference numeral 704 in FIG. 7. As the target 707, there was used a ZnO target (purity: 99.9%). The distance between the substrate 704 and the target 707 was 5 cm. The magnetic field intensity at the surface of the target 707 in the horizontal direction was 350 Gauss.

Film formation in the magnetron sputtering apparatus was conducted in the following manner. That is, the substrate was maintained at 350° C., Ar gas and $O_2$ gas were introduced into the deposition chamber 701 through the gas feed pipe 702 at respective flow rates of 20 sccm and 1.5 sccm, and the inner pressure of the sputtering chamber was adjusted to and maintained at a vacuum of 2 mTorr. Thereafter, the power source 709 was switched on to apply a RF power of 200 W through the cathode 708 to cause glow discharge thereby generating plasma between the substrate 704 and the target 707, whereby the target was sputtered with the plasma to cause the formation of a zinc oxide film on the surface of the substrate 704 at a deposition rate of 10 Å/sec. A 4000 Å thick zinc oxide film as the transparent conductive layer 203 was formed on the surface of the substrate (that is, the copper plate). Thus, there was obtained a back reflector.

The surface state of the zinc oxide film as the transparent conductive layer was examined by using a commercially available scanning electron microscope (SEM). As a result, the zinc oxide film was found to have an uneven surface provided with irregularities of about 6000 Å in terms of the mean pitch.

Further, the zinc oxide film was subjected to X-ray diffraction by using the X-ray diffractometer as in Experiment 3. As a result, the zinc oxide film was found to have a value of 0.001 in terms of the ratio of the diffraction peak intensity of the Zn (1,0,1) planes versus the diffraction peak intensity of the ZnO (0,0,2) planes and a value of 0.003 in terms of the ratio of the diffraction peak intensity of the $ZnO_2$ (2,0,0) planes versus the diffraction peak intensity of the ZnO (0,0,2) planes.

On the uneven surface of the zinc oxide film as the transparent conductive layer 203, there was formed a thin film active semiconductor layer with a pin junction in the following manner using a commercially available capacitive coupling type CVD apparatus (trademark name: CHJ-3030, produced by Alback Company).

Particularly, the substrate having the above zinc oxide as the transparent and conductive region was placed in the deposition chamber of the capacitive coupling type RF-CVD apparatus, followed by evacuating the inside of the deposition chamber to a desired vacuum, wherein the substrate was heated to and maintained at 250° C. Thereafter, $SiH_4$ gas, $SiF_4$ gas, $PH_3$ gas diluted with $H_2$ gas to 1 vol. %, and $H_2$ gas were introduced into the deposition chamber at respective flow rates of 300 sccm, 4 sccm, 55 sccm, and 40 sccm. Then, the gas pressure (the inner pressure) in the deposition chamber was controlled to 1 Torr. After the four gases became stable at the above respective flow rates and the inner pressure also became stable at the above vacuum degree, a RF power of 200 W (13.56 MHz) from the RF power source was applied to cause glow discharge in the deposition chamber. This glow discharging was continued for 5 minutes, to thereby form an n-type a-Si semiconductor layer 205 on the uneven surface of the zinc oxide film as the transparent conductive layer 203. After this, the application of the RF power and the introduction of the film-forming raw material gases were terminated, the inside of the deposition chamber was evacuated to a desired vacuum. Then, $SiH_4$ gas, $GeH_4$ gas, $SiF_4$ gas and $H_2$ gas were introduced into the deposition chamber at respective flow rates of 200 sccm, 100 sccm, 4 sccm, and 40 sccm, followed by controlling the gas pressure (the inner pressure) in the deposition chamber to 1 Torr. After the four gases became stable at the above respective flow rates and the inner pressure also became stable at the above vacuum degree, a RF power of 150 W (13.56 MHz) from the RF power source was applied to cause glow discharge in the deposition chamber. This glow discharging was continued for 40 minutes, to thereby form an i-type a-SiGe semiconductor layer 206 on the previously formed n-type semiconductor layer 205. After this, the application of the RF power and the introduction of the film-forming raw material gases were terminated, and the inside of the deposition chamber was evacuated to a desired vacuum. Then, $SiH_4$ gas, $BF_3$ gas diluted to 1 vol. % with $H_2$ gas, and $H_2$ gas were introduced into the deposition chamber at respective flow rates of 50 sccm, 50 sccm, and 500 sccm, followed by controlling the gas pressure (the inner pressure) in the deposition chamber to 1 Torr. After the three gases became stable at the above respective flow rates and the inner pressure also became stable at the above vacuum degree, a RF power of 300 W (13.56 MHz) from the RF power source was applied to cause glow discharge in the deposition chamber. This glow discharging was continued for 2 minutes, to thereby form a p-type uc-Si semiconductor layer 207 on the previously formed i-type semiconductor layer 206. After this, the application of the RF power and the introduction of the film-forming raw material gases were terminated. Thus, there was formed a thin film active semiconductor region 204 with a pin junction on the transparent conductive layer 203. Then, the resultant was taken out from the RF-CVD apparatus. The resultant was introduced into a conventional vacuum deposition apparatus, wherein an ITO film was formed on the thin film active semiconductor region 204, followed by applying a paste containing iron oxide as an etchant thereon by means of the printing technique, to thereby form a transparent electrode 208. Thereafter, an Ag paste was applied by means of the screen-printing technique, to thereby form a collecting electrode 209 on the transparent electrode 208.

In this way, there were prepared 10 photoelectric conversion devices. These devices were evaluated with respect to their photoelectric conversion characteristics under the irradiation of AM 1.5 light (100 mW/cm$^2$). As a result, it was found that each of the devices exhibited a satisfactory photoelectric conversion efficiency of 8.4±0.2%.

Comparative Example 1

The procedures of Example 1 were repeated, except that the flow rate of the $O_2$ gas during forming of the zinc oxide film was changed to 0.5 sccm, to thereby obtain 10 photoelectric conversion devices.

In the above, before forming the thin film active semiconductor region of each device, the zinc oxide film as the transparent conductive layer was subjected to X-ray diffraction by using the X-ray diffractometer as in Experiment 3. As a result, the zinc oxide film was found to have a value of 0.012 in terms of the ratio of the diffraction peak intensity of the Zn (1,0,1) planes versus the diffraction peak intensity of the ZnO (0,0,2) planes and a value of 0.000 in terms of the ratio of the diffraction peak intensity of the $ZnO_2$ (2,0,0) planes versus the diffraction peak intensity of the ZnO (0,0,2) planes.

The resultant 10 devices were evaluated with respect to their photoelectric conversion characteristics as in Example 1. As a result, it was found that each of the devices exhibited a photoelectric conversion efficiency of 7.0±0.5% which is inferior to that exhibited by each of the devices in Example 1.

Comparative Example 2

The procedures of Example 1 were repeated, except that the flow rate of the $O_2$ gas during forming of the zinc oxide film was changed to 2.5 sccm, to thereby obtain 10 photoelectric conversion devices.

In the above, before forming the thin film active semiconductor region of each device, the zinc oxide film as the transparent conductive layer was subjected to X-ray diffractometer as in Experiment 3. As a result, the zinc oxide film was found to have a value of 0.000 in terms of the ratio of the diffraction peak intensity of the Zn (1,0,1) planes versus the diffraction peak intensity of the ZnO (0,0,2) planes and a value of 0.010 in terms of the ratio of the diffraction peak intensity of the $ZnO_2$ (2,0,0) planes versus the diffraction peak intensity of the ZnO (0,0,2) planes.

The resultant 10 devices were evaluated with respect to their photoelectric conversion characteristics as in Example 1. As a result, it was found that each of the devices exhibited a photoelectric conversion efficiency of 7.0±0.5% which is inferior to that exhibited by each of the devices in Example 1.

Example 2

As described below, there were prepared 10 pin junction type a-Si photoelectric conversion devices of the configuration shown FIG. 1.

There was provided a well-cleaned Ni-plated iron plate of 1 mm in thickness and 5 cm×5 cm in size as the substrate 101. On the surface of this iron plate as the substrate 101, there was formed an Ag film having an uneven surface and having a thickness of 3000 Å in terms of the mean value as the metal layer 102 by means of a conventional plating technique. Then, on the uneven surface of the Ag film as the metal layer 102, there was formed a 4000 Å thick zinc oxide film as the transparent conductive layer 103 by means of a conventional electron beam vacuum deposition technique wherein the zinc oxide film was formed at a deposition rate of 20 Å/sec. by maintaining the substrate at 100° C., and evaporating a Zn source under a condition of 0.5 mTorr inner pressure while supplying $O_2$ gas into the deposition space.

Thus, there was formed a back reflector. The zinc oxide film thus formed was subjected to X-ray diffraction by using the X-ray diffractometer as in Experiment 3. As a result, the zinc oxide film was found to have a value of 0.003 in terms of the ratio of the diffraction peak intensity of the Zn (1,0,1) planes versus the diffraction peak intensity of the ZnO (0,0,2) planes and a value of 0.001 in terms of the ratio of the diffraction peak intensity of the $ZnO_2$ (2,0,0) planes versus the diffraction peak intensity of the ZnO (0,0,2) planes.

On the surface of the zinc oxide film as the transparent conductive layer 103, there was formed a thin film active semiconductor region 104 with a pin junction by repeating the procedures of Example 1.

The resultant 10 devices were evaluated with respect to their photoelectric conversion characteristics in the same manner as in Example 1. As a result, it was found that each of the devices exhibits a satisfactory photoelectric conversion efficiency of 8.2±0.3%.

Comparative Example 3

The procedures of Example 2 were repeated, except that the inner pressure during forming of the zinc oxide film was changed to 0.3 mTorr by controlling the flow rate of the $O_2$ gas, to thereby obtain 10 photoelectric conversion devices.

In the above, before forming the thin film active semiconductor region of each device, the zinc oxide film as the transparent conductive layer was subjected to X-ray diffraction by using the X-ray diffractometer as in Experiment 3. As a result, the zinc oxide film was found to have a value of 0.019 in terms of the ratio of the diffraction peak intensity of the Zn (1,0,1) planes versus the diffraction peak intensity of the ZnO (0,0,2) planes and a value of 0.001 in terms of the ratio of the diffraction peak intensity of the $ZnO_2$ (2,0,0) planes versus the diffraction peak intensity of the ZnO (0,0,2) planes.

The resultant 10 devices were evaluated with respect to their photoelectric conversion characteristics as in Example 1. As a result, it was found that each of the devices exhibited a photoelectric conversion efficiency of 6.5±1.2% which is inferior to that exhibited by each of the devices in Example 2.

Comparative Example 4

The procedures of Example 2 were repeated, except that the inner pressure during forming of the zinc oxide film was changed to 0.7 mTorr by controlling the flow rate of the $O_2$ gas, to thereby obtain 10 photoelectric conversion devices.

In the above, before forming the thin film active semiconductor region of each device, the zinc oxide film as the transparent conductive layer was subjected to X-ray diffraction by using the X-ray diffractometer as in Experiment 3. As a result, the zinc oxide film was found to have a value of 0.002 in terms of the ration of the diffraction peak intensity of the Zn (1,0,1) planes versus the diffraction peak intensity of the ZnO (0,0,2) planes and a value of 0.011 in terms of the ratio of the diffraction peak intensity of the $ZnO_2$ (2,0,0) planes versus the diffraction peak intensity of the ZnO (0,0,2) planes.

The resultant 10 devices were evaluated with respect to their photoelectric conversion characteristics as in Example 1. As a result, it was found that each of the devices exhibited a photoelectric conversion efficiency of 7.8±0.5% which is inferior to that exhibited by each of the devices in Example 2.

Example 3

Figure 9:
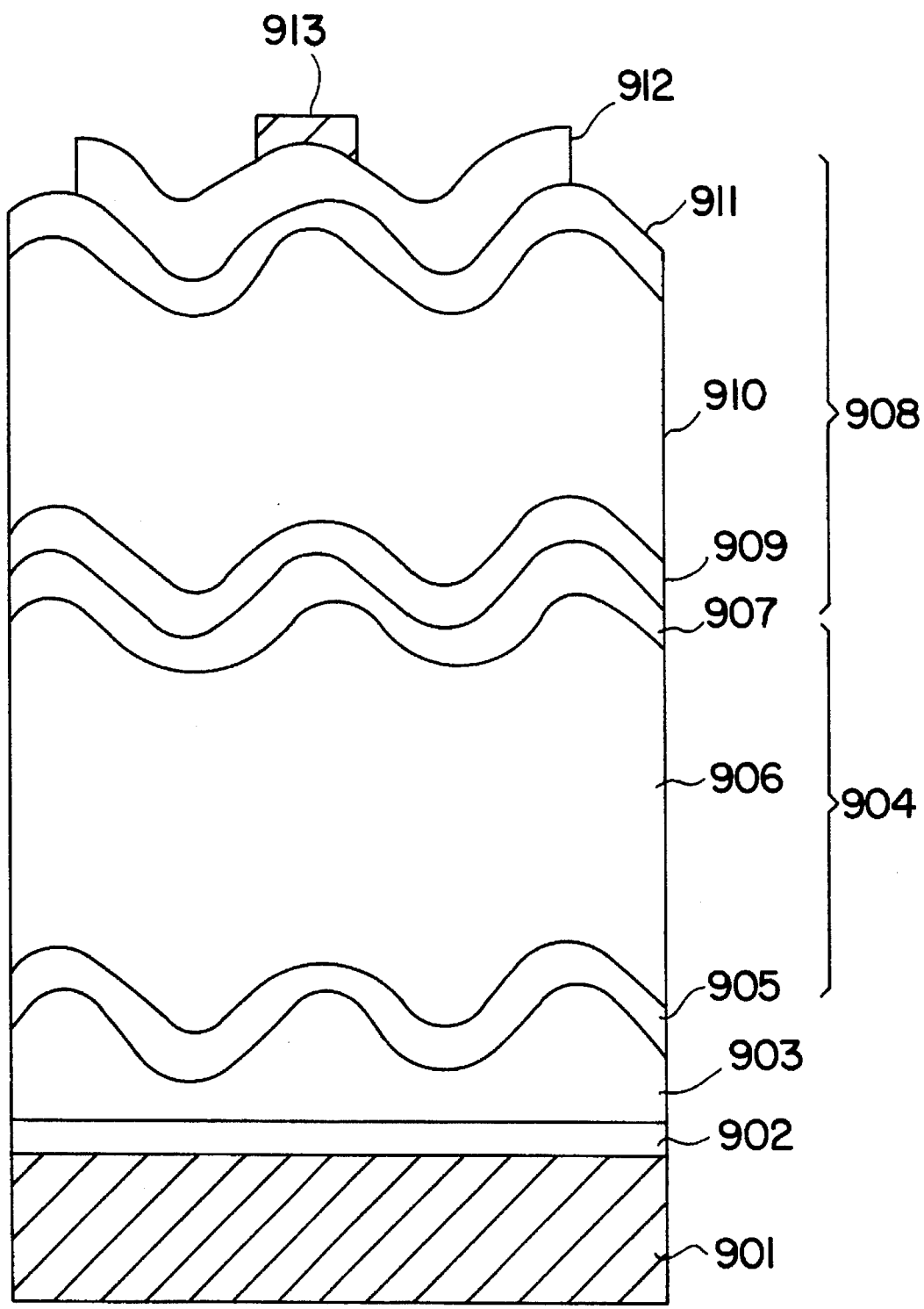
FIG. 9 is a schematic cross-sectional view illustrating the configuration of a further example of a photoelectric conversion device according to the present invention.

There were prepared a plurality of tandem-type photoelectric conversion devices (solar cells) of the configuration shown in FIG. 9. The tandem-type photoelectric conversion device shown in FIG. 9 comprises a substrate 901, a metal layer 902, a transparent conductive layer 903, a bottom cell 904 comprising an n-type a-Si semiconductor film 905, an i-type a-SiGe semiconductor film 906 and a p-type uc-Si semiconductor film 907, a top cell 908 comprising an n-type a-Si semiconductor film 909, an i-type a-Si semiconductor film 910, and a p-type uc-Si semiconductor film 911, a transparent electrode 912, and a collecting electrode 913.

Said plurality of tandem-type photoelectric conversion devices were continuously formed using a web substrate in the following manner.

Figure 8:
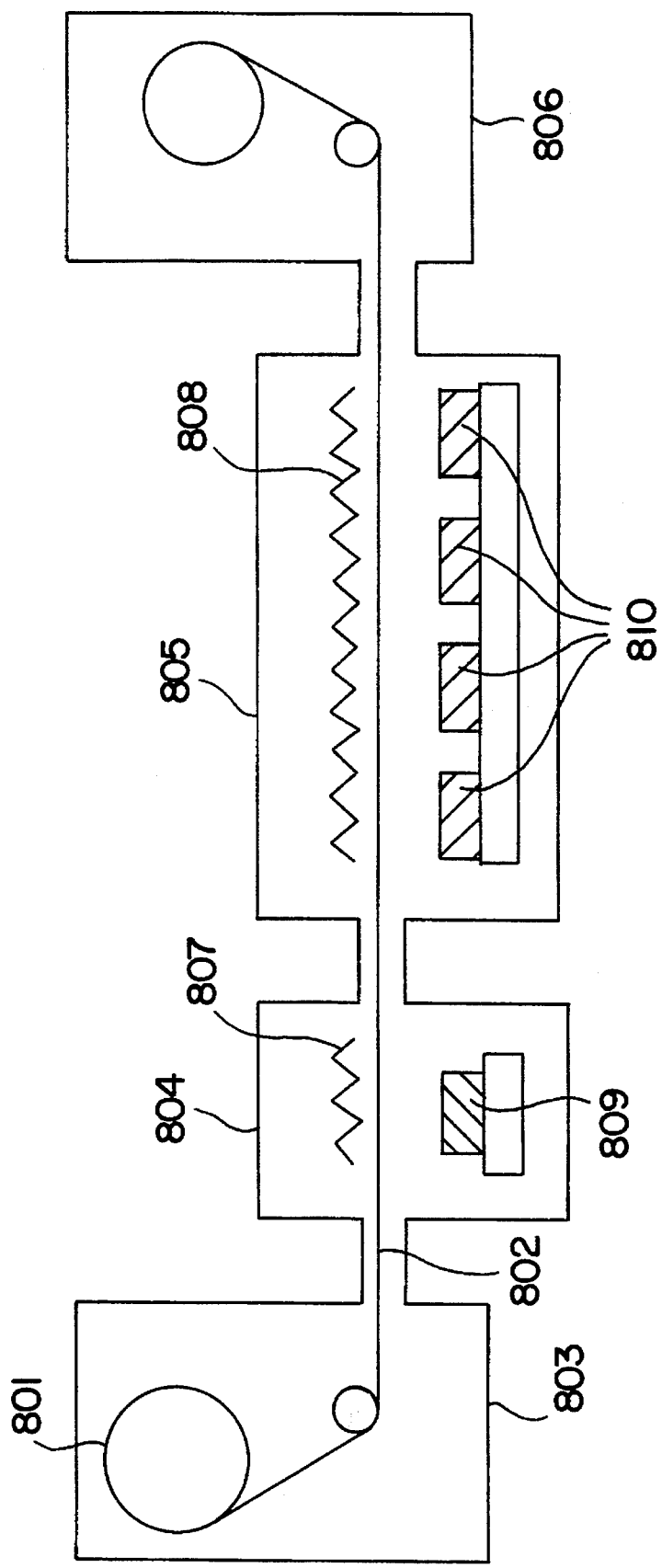
FIG. 8 is a schematic diagram illustrating another sputtering apparatus suitable for the formation of the back reflection layer of the present invention.

Firstly, their back reflector was formed using a continuous film-forming apparatus of the constitution shown in FIG. 8. In FIG. 8, reference numeral 801 indicates a pay-out reel having a substrate 802 comprising a stainless steel web of 0.2 mm in thickness and 350 mm in width wound thereon, and the pay-out reel 801 is housed in a delivery chamber 803. Reference numeral 804 indicates a first DC magnetron sputtering chamber serving to form an Ag film on the web substrate 802. The first DC magnetron sputtering chamber 804 is connected to the delivery chamber 803 through a gate valve. The first DC magnetron sputtering chamber 804 is of the same constitution as the foregoing magnetron sputtering apparatus shown in FIG. 7 provided with the magnet mechanism shown in FIG. 10(B). The first DC magnetron sputtering chamber 804 contains an Ag target (purity: 99.99%) 809 positioned on a cathode, and an electric heater 807 for heating the web substrate 802. Herein, the magnetic field intensity at the surface of the target 809 in the horizontal direction was found to be 300 Gauss. Reference numeral 805 indicates a second DC magnetron sputtering chamber serving to form a zinc oxide film on the web substrate 802. The second DC magnetron sputtering chamber 805 is connected to the first magnetron sputtering chamber 804 through a gate valve. The second DC magnetron sputtering chamber 805 is of the same constitution as the foregoing magnetron sputtering apparatus shown in FIG. 7 provided with the magnet mechanism shown in FIG. 10(B). The second DC magnetron sputtering chamber 805 contains four ZnO targets 810 (purity: 99.9%) positioned on a cathode, and an electric heater 808 for heating the web substrate 802. Herein, the magnetic field at the surface of each target in the horizontal direction was found to be 350 Gauss. Reference numeral 806 indicates a take-up chamber which contains a take-up reel serving to take-up the web substrate 802. The take-up chamber 806 is connected to the second DC magnetron sputtering chamber 805 through a gate valve.

The formation of the back reflector using the film-forming apparatus of FIG. 8 was conducted as follows.

That is, firstly, the web substrate 802 was paid out from the pay-out reel 801, delivered through a guide roller to pass through the first DC magnetron sputtering chamber 804 and the second DC magnetron sputtering chamber 805, and wound onto the take-up reel in the take-up chamber 806, wherein the web substrate 802 was properly tensioned. Then, while moving the web substrate toward the take-up chamber 806 at a moving speed of 20 cm/minute, in the first DC magnetron sputtering chamber 804 there was formed a 1600 Å thick Ag film as the metal layer on the web substrate 802 by maintaining the web substrate at 200° C., introducing Ar gas, maintaining the inner pressure at 3 mTorr and applying a DC voltage of 600 V through the cathode to sputter the Ag target with plasma generated wherein an electric current of 6 AMP was flowed through the Ag target 809. Then, in the second DC magnetron sputtering, there was formed a zinc oxide film having an uneven surface and a thickness of 3200 Å in terms of the mean value as the transparent conductive layer 903 on the surface of the previously formed Ag film by maintaining the web substrate at 280° C., introducing a gas mixture composed of Ar gas and $O_2$ gas in an amount corresponding 20 vol. % versus the Ar gas, maintaining the inner pressure at 3 mTorr, and applying a DC voltage of 500 V through the cathode to sputter the ZnO targets 810 with plasma generated wherein an electric current of 6 AMP flowed through each ZnO target. In this case, the web substrate was wound on the take-up reel in the take-up chamber while being cooled to room temperature. Thus, there was continuously formed a back reflector on the web substrate 802. The web substrate wound on the take-up reel was removed from the take-up chamber.

Then, the zinc oxide film as the transparent and conductive region 903 was subjected to X-ray diffraction by using the X-ray diffractometer as in Experiment 3. As a result, the zinc oxide film was found to have a value of 0.004 in terms of the ratio of the diffraction peak intensity of the Zn (1,0,1) planes versus the diffraction peak intensity of the ZnO (0,0,2) planes and a value of 0.003 in terms of the ratio of the diffraction peak intensity of the $ZnO_2$ (2,0,0) planes versus the diffraction peak intensity of the ZnO (0,0,2) planes.

The web substrate having the back reflector comprising the Ag film as the metal layer 902 and the zinc oxide film as the transparent conductive layer 903 was introduced into the roll-to-roll film forming apparatus described in U.S. Pat. No. 4,492,181, wherein a bottom cell 904 and a top cell 908 were successively formed on the surface of the zinc oxide film as the transparent conductive layer 903. On the surface of the top cell, a transparent electrode 912 and a collecting electrode 913 were successively formed as in Example 1.

The web substrate was cut to obtain 100 photoelectric conversion devices. The result devices were evaluated with respect to their photoelectric conversion characteristics as in Example 1. As a result, it was found that each the devices exhibited a satisfactory photoelectric conversion efficiency of 11.6±0.2%.

Example 4

The procedures of Example 1 were repeated, except that the thin film a-Si active semiconductor region was changed to a thin film active semiconductor region composed of a compound semiconductor to obtain 10 photoelectric conversion devices.

The above thin film semiconductor region was formed as follows. Firstly, on the uneven surface of the zinc oxide film as the transparent conductive layer, a 0.2 μm thick Cu film and then, a 0.4 μm thick In film were formed respectively by means of a conventional sputtering process. The resultant was then introduced into a conventional quartz bell-jar, wherein a gas comprising $H_2Se$ diluted to 10 vol. % with $H_2$ gas was introduced into the reaction space while maintaining the substrate at 400° C. to thereby form a $CuInSe_2$ thin film, followed by forming a 0.1 μm thick CdS film by means of a conventional sputtering process. The compound semiconductor thus formed was subjected to annealing treatment at 250° C., to form a pn junction.

Thus, there were obtained 10 photoelectric conversion devices. These devices were evaluated with respect to their photoelectric conversion characteristics as in Example 1. As a result, it was found that each of the devices exhibited a satisfactory photoelectric conversion efficiency of about 9.5%. From this, it was found that the zinc oxide film as the transparent conductive layer according to the present invention is effective in a photoelectric conversion device provided with a thin film semiconductor region composed of a given compound semiconductor other than the a-Si thin film semiconductor.

TABLE 1(A)

| $O_2$/Ar | Zn/ZnO | $ZnO_2$/ZnO | Jsc (mA/cm$^2$) | Voc (V) | FF | η (%) |
|---|---|---|---|---|---|---|
| 20% | 0.015 | 0.000 | 17.2 | 0.61 | 0.64 | 6.71 |
| 40% | 0.010 | 0.000 | 19.0 | 0.61 | 0.63 | 7.18 |
| 60% | 0.006 | 0.000 | 20.5 | 0.61 | 0.63 | 7.88 |
| 70% | 0.005 | 0.000 | 21.0 | 0.62 | 0.64 | 8.33 |
| 80% | 0.003 | 0.000 | 21.3 | 0.62 | 0.64 | 8.45 |
| 90% | 0.002 | 0.000 | 21.4 | 0.63 | 0.62 | 8.36 |
| 100% | 0.000 | 0.000 | 21.5 | 0.64 | 0.60 | 8.23 |
| 110% | 0.000 | 0.002 | 21.5 | 0.66 | 0.60 | 8.51 |
| 120% | 0.000 | 0.004 | 21.4 | 0.67 | 0.59 | 8.46 |
| 130% | 0.000 | 0.005 | 21.3 | 0.67 | 0.59 | 8.42 |
| 140% | 0.000 | 0.009 | 20.9 | 0.66 | 0.58 | 7.78 |

TABLE 1(A)-continued

| $O_2$/Ar | Zn/ZnO | $ZnO_2$/ZnO | Jsc (mA/cm$^2$) | Voc (V) | FF | η (%) |
|---|---|---|---|---|---|---|
| 160% | 0.000 | 0.015 | 20.6 | 0.64 | 0.59 | 7.77 |
| 180% | 0.000 | 0.193 | 20.3 | 0.64 | 0.59 | 7.67 |
| 200% | 0.000 | 0.276 | 20.0 | 0.65 | 0.58 | 7.54 |

TABLE I (B)

| | initial Jsc (mA/cm$^2$) | Jsc after 20 hours lapsed (mA/cm$^2$) |
|---|---|---|
| 20% | 17.2 | 16.8 |
| 40% | 19.0 | 19.0 |
| 60% | 20.5 | 20.5 |
| 70% | 21.0 | 21.0 |
| 80% | 21.3 | 21.3 |
| 90% | 21.4 | 21.4 |
| 100% | 21.5 | 21.0 |
| 110% | 21.5 | 21.5 |
| 120% | 21.4 | 21.4 |
| 130% | 21.3 | 21.3 |
| 140% | 20.9 | 20.9 |
| 160% | 20.6 | 20.6 |
| 180% | 20.3 | 20.0 |
| 200% | 20.0 | 19.2 |

TABLE 2

| substrate temperature (°C.) | Zn/ZnO | $ZnO_2$/ZnO | flow rate of $O_2$ gas |
|---|---|---|---|
| 100 | 0.012 | 0.000 | 10 sccm |
| 150 | 0.008 | 0.000 | 10 sccm |
| 150 | 0.004 | 0.000 | 15 sccm |
| 200 | 0.003 | 0.000 | 10 sccm |
| 250 | 0.001 | 0.001 | 10 sccm |
| 300 | 0.000 | 0.005 | 10 sccm |
| 350 | 0.000 | 0.015 | 10 sccm |
| 350 | 0.000 | 0.005 | 6 sccm |
| 400 | 0.000 | 0.022 | 10 sccm |
| 450 | 0.000 | 0.035 | 10 sccm |

TABLE 3

| inner pressure | Zn/ZnO | $ZnO_2$/ZnO | apparatus type |
|---|---|---|---|
| 0.5 mTorr | no discharge occurred | | no magnetron*[1] |
| 0.75 mTorr | no discharge occurred | | no magnetron*[1] |
| 1.0 mTorr | no discharge occurred | | no magnetron*[1] |
| 2.0 mTorr | no discharge occurred | | no magnetron*[1] |
| 3.0 mTorr | 0.004 | 0.005 | no magnetron*[1] |
| 5.0 mTorr | 0.005 | 0.014 | no magnetron*[1] |
| 10.0 mTorr | 0.007 | 0.057 | no magnetron*[1] |
| 20.0 mTorr | 0.022 | 0.105 | no magnetron*[1] |
| 0.5 mTorr | no discharge occurred | | magnetron*[2] |
| 0.75 mTorr | 0.000 | 0.000 | magnetron*[2] |
| 1.0 mTorr | 0.001 | 0.001 | magnetron*[2] |
| 2.0 mTorr | 0.001 | 0.002 | magnetron*[2] |
| 3.0 mTorr | 0.002 | 0.004 | magnetron*[2] |
| 5.0 mTorr | 0.005 | 0.010 | magnetron*[2] |
| 10.0 mTorr | 0.007 | 0.020 | magnetron*[2] |
| 20.0 mTorr | 0.012 | 0.052 | magnetron*[2] |

*[1]: no magnet used
*[2]: magnet used

TABLE 4

| substrate temperature (°C.) | Zn/ZnO | $ZnO_2$/ZnO | irregularity | Jsc |
|---|---|---|---|---|
| 150 | 0.004 | 0.000 | 0.3 μm | 21.2 mA/cm$^2$ |
| 250 | 0.001 | 0.001 | 0.5 μm | 21.8 mA/cm$^2$ |
| 350 | 0.000 | 0.005 | 0.7 μm | 22.1 mA/cm$^2$ |

What is claimed:

1. A photovoltaic conversion device comprising at least a metal layer, a transparent conductive layer disposed on said metal layer, and an active semiconductor layer disposed on said transparent conductive layer, characterized in that said transparent conductive layer comprises a layer having an uneven surface which is composed of a zinc oxide material $Zn_{1-x}O_x$ (0<x<1) having an X-ray diffraction pattern in which (a) the peak intensity of the (2,0,0) planes of $ZnO_2$ is 1/200 or less of (b) the peak intensity of the (0,0,2) planes of ZnO and (c) the peak intensity of the (1,0,1) planes of Zn is 1/200 or less of the peak intensity (b).

2. A photoelectric conversion device according to claim 1, wherein the zinc oxide material contains ZnO as the main constituent and at least one of Zn and $ZnO_2$.

3. A photoelectric conversion device according to claim 2, wherein Zn is contained in the zinc oxide material in an amount in the range of 150 to 400 ppm.

4. A photoelectric conversion device according to claim 2, wherein $ZnO_2$ is contained in the zinc oxide material in an amount in the range of 250 to 600 ppm.

5. A photoelectric conversion device according to claim 1, wherein the active semiconductor layer comprises a silicon-containing non-single crystal semiconductor.

6. A photoelectric conversion device according to claim 1, wherein the metal layer is composed of a metal selected from the group consisting of Ag, Al, and Cu.

7. A photoelectric conversion device according to claim 1, wherein the transparent conductive layer has a polycrystalline structure.

8. A photoelectric conversion device according to claim 1, wherein the transparent conductive layer has a microcrystalline structure.

9. A photoelectric conversion device according to claim 1, wherein the zinc oxide material has a resistivity in the range of $1\times10^{-5}$ to $1\times10^2$ Ω/cm$^2$.

10. A photoelectric conversion device according to claim 1, wherein the zinc oxide material contains a metal selected from the group consisting of Al and Cu.

11. A photoelectric conversion device according to claim 1, wherein the active semiconductor layer has a tandem structure.

12. A photoelectric conversion device according to claim 11, wherein the tandem structure is a stacked structure comprising a non-single crystal silicon semiconductor and a non-single crystal silicon-germanium semiconductor.

13. A photoelectric conversion device according to claim 1, wherein the uneven surface of the transparent conductive layer is provided with irregularities of 0.3 to 0.7 μm in terms of the mean pitch.

14. A photoelectric conversion device according to claim 1, wherein the active semiconductor layer comprises a compound semiconductor.

15. A photoelectric conversion device according to claim 14, wherein the compound semiconductor has a stacked structure comprising CIS/CdS.

16. A photoelectric conversion according to claim 1 which has a pin junction.

17. A photoelectric conversion according to claim 1 which has a pn junction.

18. A photoelectric conversion device according to claim 1, wherein the zinc oxide material is a zinc oxide material formed by a magnetron sputtering process wherein the formation of said zinc oxide material is conducted under conditions of maintaining the sputtering chamber pressure at 3 mTorr or below, maintaining the substrate at a temperature in the range of 150° to 350° C., and supplying $O_2$ gas or an oxygen-containing compound gas.

19. A photoelectric conversion device according to claim 1, wherein the zinc oxide material is a zinc oxide material formed by a reactive vacuum deposition process wherein the formation of said zinc oxide material is conducted under conditions of maintaining the vacuum chamber pressure at 0.5 mTorr or below, maintaining the substrate at a temperature in the range of 100° to 250° C., and supplying $O_2$ gas or an oxygen-containing compound gas.

20. A photoelectric conversion device according to claim 18 or 19, wherein the oxygen-containing compound gas is $H_2O$, $NO$, $NO_2$, $CO$, $CO_2$, or $CH_3OH$.

* * * * *

UNITED STATES PATENT AND TRADEMARK OFFICE
CERTIFICATE OF CORRECTION

PATENT NO. : 5,453,135
DATED : September 26, 1995
INVENTOR(S) : KATSUMI NAKAGAWA, ET AL.

It is certified that error appears in the above-identified patent and that said Letters Patent is hereby corrected as shown below:

COLUMN 4

Line 22, "is" should read --is to--.

COLUMN 14

Line 62, "70$_2$" should read --702--.

COLUMN 16

Line 52, "1002having" should read --1002 having--.
Line 57, "100$_2$" should read --1002--.

COLUMN 29

Line 4, "claim 1" should read --claim 1,--.
Line 6, "claim 1" should read --claim 1,--.

Signed and Sealed this

Twentieth Day of February, 1996

Attest:

BRUCE LEHMAN

*Commissioner of Patents and Trademarks*

*Attesting Officer*